(12) United States Patent
Tran et al.

(10) Patent No.: US 9,472,284 B2
(45) Date of Patent: Oct. 18, 2016

(54) THREE-DIMENSIONAL FLASH MEMORY SYSTEM

(71) Applicants: Hieu Van Tran, San Jose, CA (US); Hung Quoc Nguyen, Fremont, CA (US); Mark Reiten, Millbrae, CA (US)

(72) Inventors: Hieu Van Tran, San Jose, CA (US); Hung Quoc Nguyen, Fremont, CA (US); Mark Reiten, Millbrae, CA (US)

(73) Assignee: Silicon Storage Technology, Inc., San Jose, CA (US)

( * ) Notice: Subject to any disclaimer, the term of this patent is extended or adjusted under 35 U.S.C. 154(b) by 747 days.

(21) Appl. No.: 13/680,719

(22) Filed: Nov. 19, 2012

(65) Prior Publication Data

US 2014/0140138 A1 May 22, 2014

(51) Int. Cl.

| | | |
|---|---|---|
| *G11C 11/34* | (2006.01) |
| *G11C 16/06* | (2006.01) |
| *G11C 5/02* | (2006.01) |
| *G11C 5/06* | (2006.01) |
| *G11C 16/30* | (2006.01) |
| *G11C 29/26* | (2006.01) |
| *G11C 16/04* | (2006.01) |
| *G11C 16/26* | (2006.01) |
| *G11C 7/04* | (2006.01) |
| *G11C 29/02* | (2006.01) |
| *G11C 29/12* | (2006.01) |
| *H01L 25/065* | (2006.01) |
| *H01L 25/18* | (2006.01) |

(52) U.S. Cl.
CPC ............... *G11C 16/06* (2013.01); *G11C 5/02* (2013.01); *G11C 5/06* (2013.01); *G11C 7/04* (2013.01); *G11C 16/0483* (2013.01); *G11C 16/26* (2013.01); *G11C 16/30* (2013.01); *G11C 29/021* (2013.01); *G11C 29/022* (2013.01); *G11C 29/028* (2013.01); *G11C 29/1201* (2013.01); *G11C 29/26* (2013.01); *H01L 25/0652* (2013.01); *H01L 25/18* (2013.01); *G11C 2213/71* (2013.01); *H01L 2224/13025* (2013.01); *H01L 2224/14181* (2013.01); *H01L 2224/16145* (2013.01); *H01L 2224/16225* (2013.01); *H01L 2225/06513* (2013.01); *H01L 2225/06541* (2013.01); *H01L 2924/15311* (2013.01)

(58) Field of Classification Search
CPC .......... G11C 16/06; G11C 5/02; G11C 5/06; G11C 16/30; G11C 29/26; G11C 16/0483; G11C 16/26; G11C 7/04; G11C 29/021; G11C 29/022; G11C 29/028; G11C 29/1201; H01L 25/0652; H01L 25/18
USPC ............. 365/185.18, 185.03, 185.21, 185.25
See application file for complete search history.

(56) References Cited

U.S. PATENT DOCUMENTS 5,313,421 A   5/1994  Guterman et al.
5,606,532 A   2/1997  Lambrache et al.
(Continued)

FOREIGN PATENT DOCUMENTS

JP   H04-284664   10/1992
JP   H08-500937   1/1996
(Continued)

OTHER PUBLICATIONS

PCT Search Report as received from the European Patent Office mailed on Jan. 27, 2014 corresponding to the related PCT Patent Application No. US13/063990.

*Primary Examiner* — Toan Le
(74) *Attorney, Agent, or Firm* — DLA Piper LLP (US)

(57) ABSTRACT

A three-dimensional flash memory system is disclosed.

40 Claims, 20 Drawing Sheets

(56) References Cited

U.S. PATENT DOCUMENTS

| | | |
|---|---|---|
| 6,591,327 B1 | 7/2003 | Briner et al. |
| 6,788,595 B2 | 9/2004 | Nguyen et al. |
| 7,046,552 B2 | 5/2006 | Chen et al. |
| 7,093,091 B2 * | 8/2006 | DeCaro ............... G06F 12/1425 365/185.33 |
| 7,868,375 B2 | 1/2011 | Liu et al. |
| 7,889,591 B1 | 2/2011 | Norman |
| 8,149,622 B2 | 4/2012 | Lee et al. |
| 8,339,865 B2 * | 12/2012 | Lavan ................ G06F 12/0246 365/185.11 |
| 8,811,093 B2 | 8/2014 | Tran et al. |
| 8,848,443 B2 | 9/2014 | Kim |
| 9,123,401 B2 | 9/2015 | Tran et al. |
| 2005/0207199 A1 | 9/2005 | Chen et al. |
| 2010/0214812 A1 | 8/2010 | Kim |
| 2010/0329011 A1 | 12/2010 | Lee et al. |
| 2011/0035542 A1 | 2/2011 | Norman |
| 2011/0079923 A1 | 4/2011 | Suh |
| 2012/0092943 A1 | 4/2012 | Nishioka |
| 2012/0124532 A1 | 5/2012 | Coteus |
| 2012/0273843 A1 | 11/2012 | Kim |
| 2013/0242672 A1 | 9/2013 | Tran et al. |
| 2014/0104965 A1 | 4/2014 | Tran et al. |

FOREIGN PATENT DOCUMENTS

| | | |
|---|---|---|
| JP | H10-500801 | 1/1998 |
| JP | 2000-90676 | 3/2000 |
| JP | 2001-23382 | 1/2001 |
| JP | 2008-96312 | 4/2008 |
| JP | 2012-518859 | 8/2012 |
| JP | 2012-532373 | 12/2012 |
| JP | 2015-515748 | 5/2015 |
| JP | 2015-536011 | 12/2015 |
| KR | 10-2011-0121671 | 11/2011 |
| TW | 201101464 | 1/2011 |
| TW | 201227878 | 7/2012 |

* cited by examiner

THREE-DIMENSIONAL FLASH MEMORY SYSTEM

TECHNICAL FIELD

A three-dimensional flash memory system is disclosed.

BACKGROUND OF THE INVENTION

Flash memory cells using a floating gate to store charges thereon and memory arrays of such non-volatile memory cells formed in a semiconductor substrate are well known in the art. Typically, such floating gate memory cells have been of the split gate type, or stacked gate type.

One prior art non-volatile memory cell 10 is shown in FIG. 1. The split gate SuperFlash (SF) memory cell 10 comprises a semiconductor substrate 1 of a first conductivity type, such as P type. The substrate 1 has a surface on which there is formed a first region 2 (also known as the source line SL) of a second conductivity type, such as N type. A second region 3 (also known as the drain line) also of a second conductivity type, such as N type, is formed on the surface of the substrate 1. Between the first region 2 and the second region 3 is a channel region 4. A bit line (BL) 9 is connected to the second region 3. A word line (WL) 8 (also referred to as the select gate) is positioned above a first portion of the channel region 4 and is insulated therefrom. The word line 8 has little or no overlap with the second region 3. A floating gate (FG) 5 is over another portion of the channel region 4. The floating gate 5 is insulated therefrom, and is adjacent to the word line 8. The floating gate 5 is also adjacent to the first region 2. A coupling gate (CG) 7 (also known as control gate) is over the floating gate 5 and is insulated therefrom. An erase gate (EG) 6 is over the first region 2 and is adjacent to the floating gate 5 and the coupling gate 7 and is insulated therefrom. The erase gate 6 is also insulated from the first region 2.

One exemplary operation for erase and program of prior art non-volatile memory cell 10 is as follows. The cell 10 is erased, through a Fowler-Nordheim tunneling mechanism, by applying a high voltage on the erase gate EG 6 with other terminals equal to zero volt. Electrons tunnel from the floating gate FG 5 into the erase gate EG 6 causing the floating gate FG 5 to be positively charged, turning on the cell 10 in a read condition. The resulting cell erased state is known as '1' state. The cell 10 is programmed, through a source side hot electron programming mechanism, by applying a high voltage on the coupling gate CG 7, a high voltage on the source line SL 2, a medium voltage on the erase gate EG 6, and a programming current on the bit line BL 9. A portion of electrons flowing across the gap between the word line WL 8 and the floating gate FG 5 acquire enough energy to inject into the floating gate FG 5 causing the floating gate FG 5 to be negatively charged, turning off the cell 10 in read condition. The resulting cell programmed state is known as '0' state.

The cell 10 can be inhibited in programming (if, for instance, another cell in its row is to be programmed but cell 10 is to not be programmed) by applying an inhibit voltage on the bit line BL 9. The cell 10 is more particularly described in U.S. Pat. No. 7,868,375, whose disclosure is incorporated herein by reference in its entirety.

Also known in other areas of art are three-dimensional integrated circuit structures. One approach is to stack two or more separately packaged integrated circuit chips and to combine their leads in a manner that allows coordinated management of the chips. Another approach is to stack two or more dies within a single package.

However, to date, the prior art has not included three-dimensional structures involving flash memory.

SUMMARY OF THE INVENTION

The aforementioned needs are addressed through multiple embodiments involving three-dimensional arrangements of flash memory arrays and associated circuitry. The embodiments provide efficiencies in physical space utilization, manufacturing complexity, power usage, thermal characteristics, and cost.

DETAILED DESCRIPTION OF THE PREFERRED EMBODIMENTS

Figure 1:
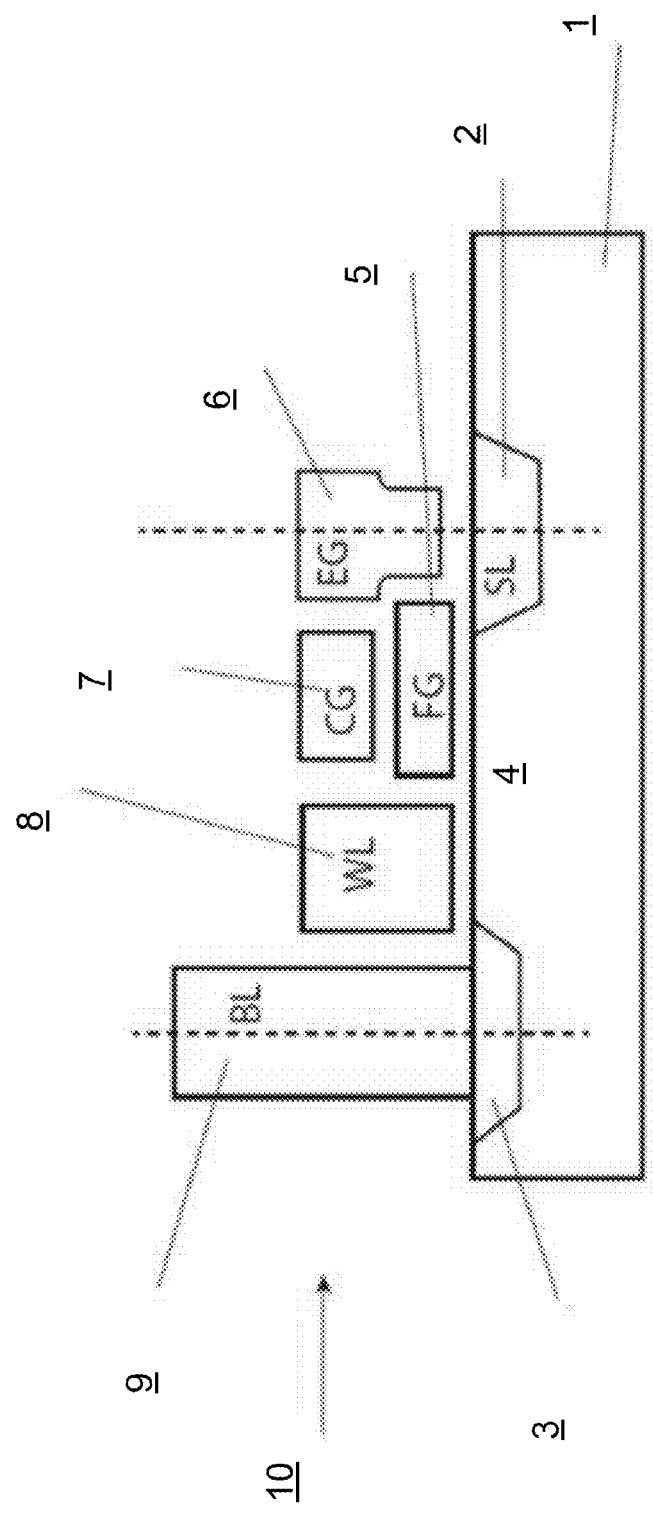
FIG. 1 is a cross-sectional view of a prior art non-volatile memory cell to which the present invention can be applied.
Figure 2:
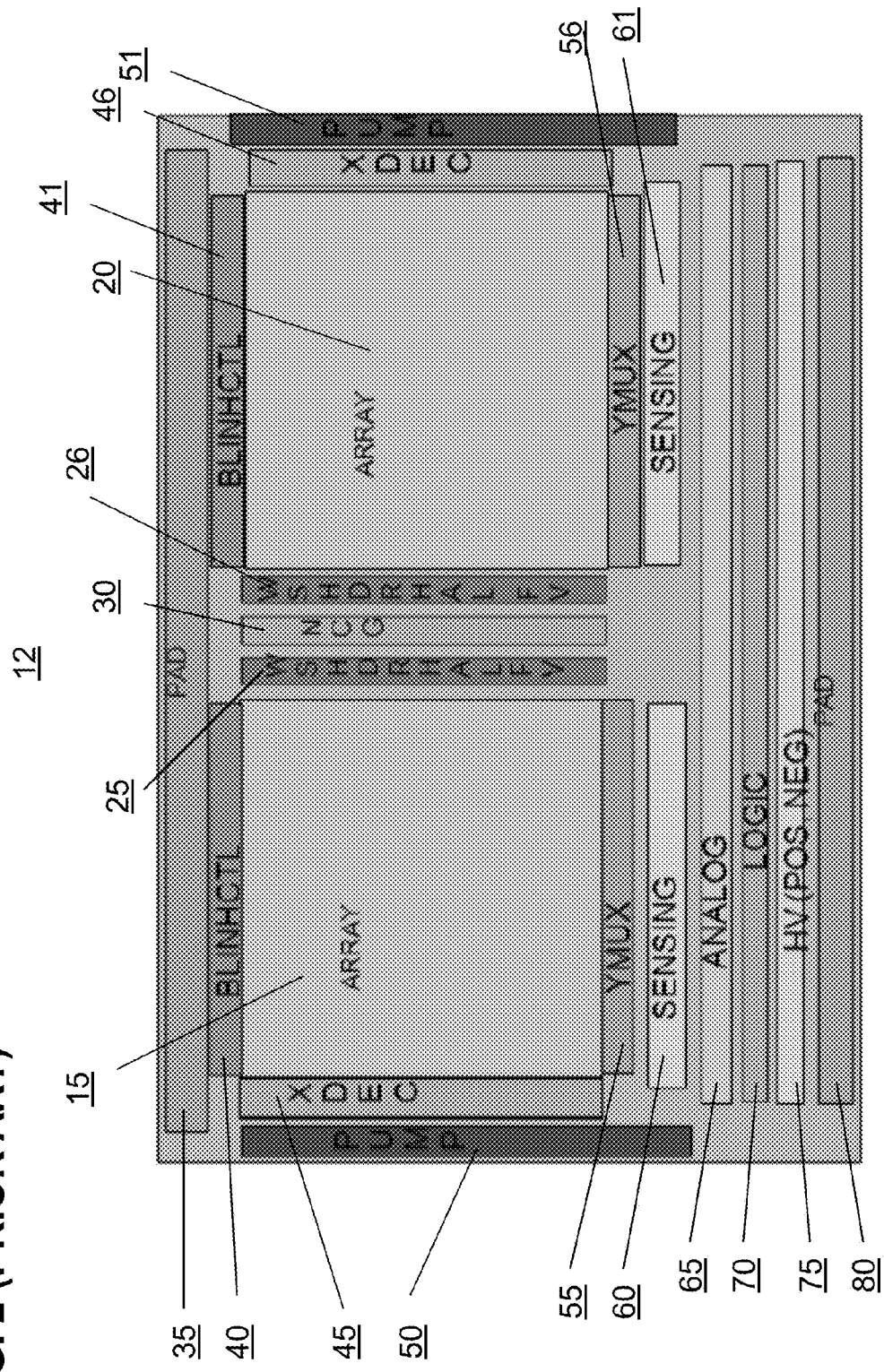
FIG. 2 depicts a prior art, two-dimensional flash memory system layout.

FIG. 2 depicts a typical prior art architecture for a two-dimensional prior art flash memory system. Die 12 comprises: memory array 15 and memory array 20 for storing data, the memory array optionally utilizing memory cell 10 as in FIG. 1; pad 35 and pad 80 for enabling electrical communication between the other components of die 12 and, typically, wire bonds (not shown) that in turn connect to pins (not shown) or package bumps that are used to access the integrated circuit from outside of the packaged chip; high voltage circuit 75 used to provide positive and negative voltage supplies for the system; control logic 70 for providing various control functions, such as redundancy and built-in self-testing; analog logic 65; sensing circuits 60 and 61 used to read data from memory array 15 and memory array 20, respectively; row decoder circuit 45 and row decoder circuit 46 used to access the row in memory array 15 and memory array 20, respectively, to be read from or written to; column decoder 55 and column decoder 56 used to access the column in memory array 15 and memory array 20, respectively, to be read from or written to; charge pump circuit 50 and charge pump circuit 51, used to provide increased voltages for read and write operations for memory array 15 and memory array 20, respectively; high voltage driver circuit 30 shared by memory array 15 and memory array 20 for read and write operations; high voltage driver circuit 25 used by memory array 15 during read and write operations and high voltage driver circuit 26 used by memory array 20 during read and write operations; and bitline inhibit voltage circuit 40 and bitline inhibit voltage circuit 41 used to un-select bitlines that are not intended to be programmed during a write operation for memory array 15 and memory array 20, respectively. These functional blocks are understood by those of ordinary skill in the art, and the block layout shown in FIG. 2 is known in the prior art. Notably, this prior art design is two-dimensional.

Figure 3:
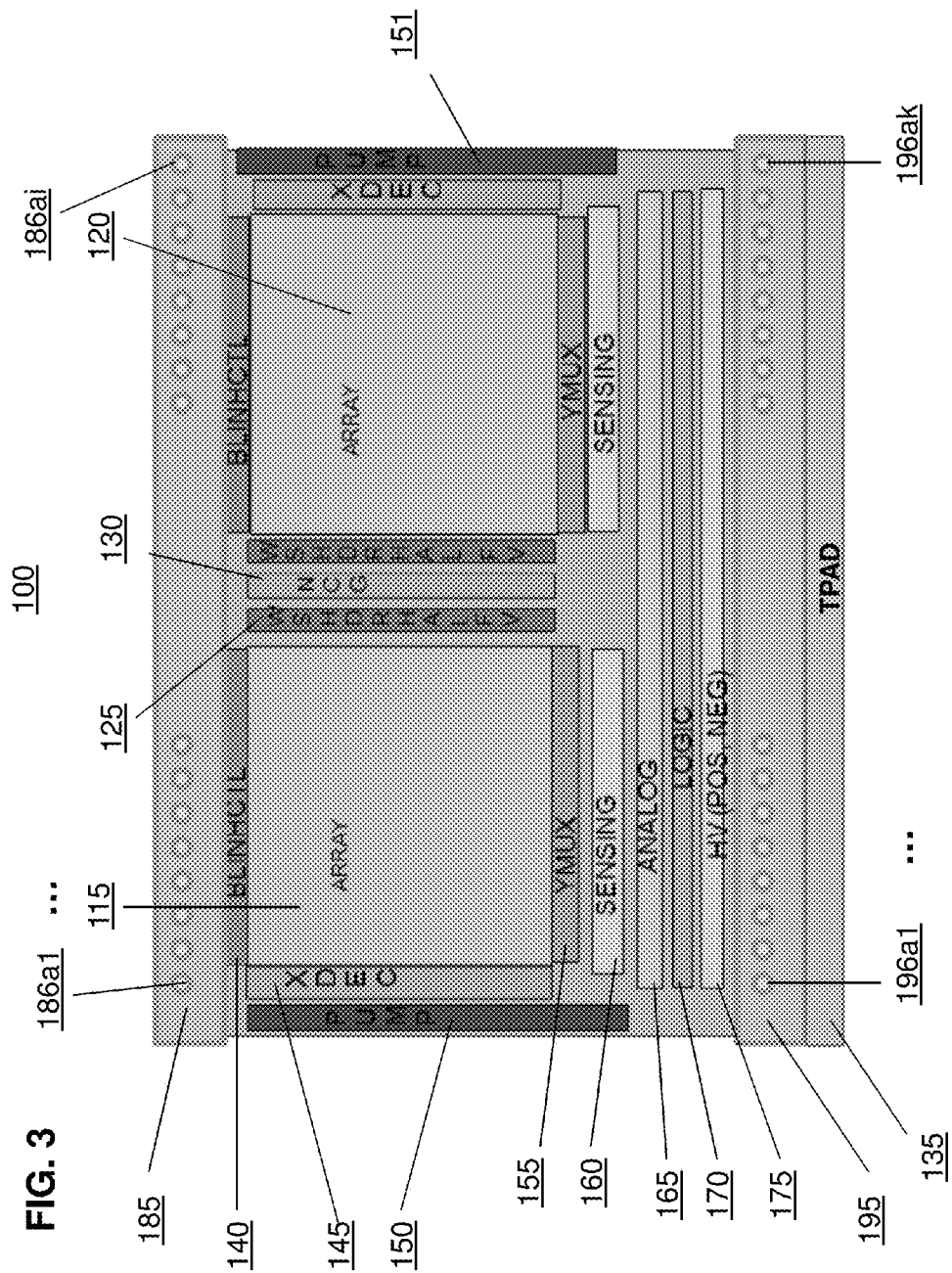
FIG. 3 depicts a first die within a three-dimensional flash memory system embodiment.

FIG. 3 depicts a first die in a three-dimensional flash memory system embodiment. Die 100 comprises many of the same components previously shown in FIG. 2. Structures that are common to two or more figures discussed herein have been given the same last two digits in the component numbering. For example, array 115 in FIG. 3 corresponds to array 15 in FIG. 2. For efficiency's sake, the description of FIG. 3 will focus on components that have not yet been described.

Die 100 comprises TSV (through-silicon via) 185 and TSV 195 and testpad block TPAD 135. TSVs are known structures in the prior art. A TSV is an electrical connection that passes through a silicon wafer or die and connects circuits that reside in different dies or layers within an integrated circuit package. TSV 185 comprises a plurality of conductors 186a1 . . . 186ai. TSV 195 comprises a plurality of conductors 196a1 . . . 196ak. Conductors 186a1 . . . 186ai and conductors 196a1 . . . 196ak are surrounded by non-conductive material, such as plastic molding.

The TSV 185 and 195 are strategically placed away from the flash arrays 115 and 120 by a predetermined distance (e.g., 30 μm) to avoid interference or other problems such as mechanical stress from TSV processing that could affect the flash arrays 115 and 120. This TSV placement strategy is applied for the other embodiments discussed herein that utilize TSVs. Conductors 186a1 . . . 186ai and conductors 196a1 . . . 196ak typically each has tens of milliohms of resistance and 50-120 femto-farads of capacitance.

The testpad block TPAD 135 includes probe pads (e.g., pad openings for a tester to electrically access the wafer) and 3D die-interface test circuits and are used by a tester to test die 100 to see if it is a good die. Such testing can include a TSV connectivity test, which involves testing the TSV prior to 3D stacking. This testing can be performed as part of a pre-bonding test. The JTAG design for a test standard (Joint Test Action Group, also known as IEEE 1149.1 Standard Test Access Port and Boundary-Scan Architecture) test method can be employed through the TPAD 135 for testing. The TSV 185 and 195 (and similarly, other TSVs described in other embodiments) can also be used for testing to identify good dies from bad dies during manufacturing. In this instance, multiple TSV conductors can be tested at one time by one tool of approximately 40-50 μm in size by a tester.

With reference still to FIG. 3, optionally die 115 can be a primary memory array and die 120 a redundant memory array.

Figure 4:
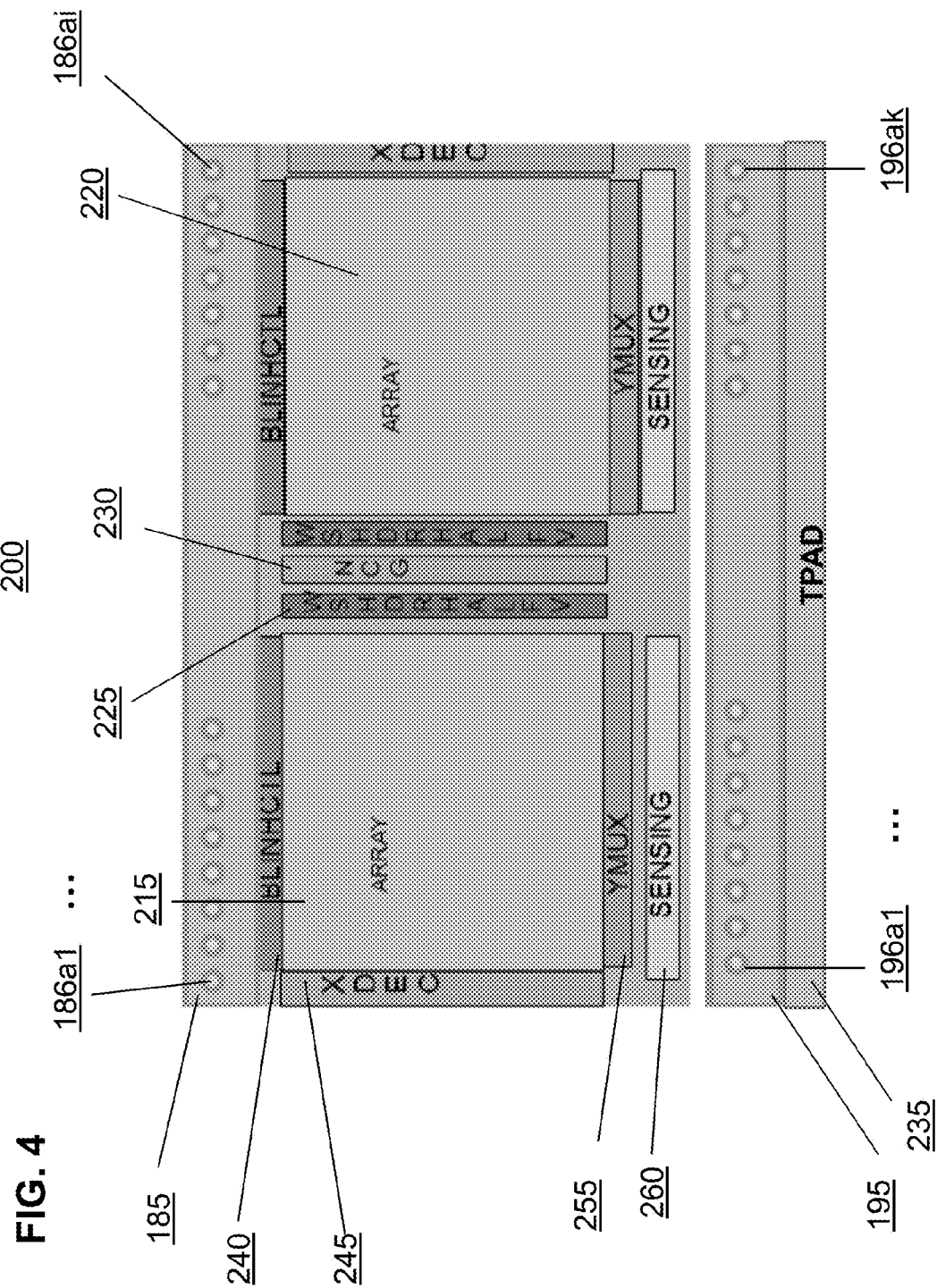
FIG. 4 depicts a second die within a three-dimensional flash memory system embodiment.

FIG. 4 depicts a second die in the three-dimensional flash memory system embodiment to be used in conjunction with die 100 shown in FIG. 3. Die 200 comprises many of the same components previously shown in FIG. 2. Again, for efficiency's sake, the description of FIG. 4 will focus on components that have not yet been described.

Die 200 comprises TSV 185 and TSV 195 shown previously in FIG. 3, as well as TPAD 235. TSV 185 and TSV 195 enable certain elements in die 100 and die 200 to be electrically connected to one another, via conductors 186a1 . . . 186ai and conductors 196a1 . . . 196ak. The testpad TPAD 235 is used by a tester to test to determine if die 200 is a good die before 3D stacking, as described previously for testpad TPAD 135 with reference to FIG. 3.

Optionally, die 215 can be a primary memory array and die 220 a redundant memory array.

Because die 200 and die 100 are located in close proximity to each other and can communicate via TSV 185 and TSV 195, die 200 is able to share certain circuit blocks with die 100. Specifically, die 200 is configured to use charge pump circuits 150 and 151, analog circuit 165, control logic 170, and high voltage circuit 175 within die 100, through TSV 185 and TSV 195. Die 200 therefore does not need to contain its own versions of those blocks. This results in efficiency in terms of physical space, manufacturing complexity, and thermal performance. Optionally, die 100 can be considered the "master" flash die and die 200 can be considered the "slave" flash die.

Figure 5:
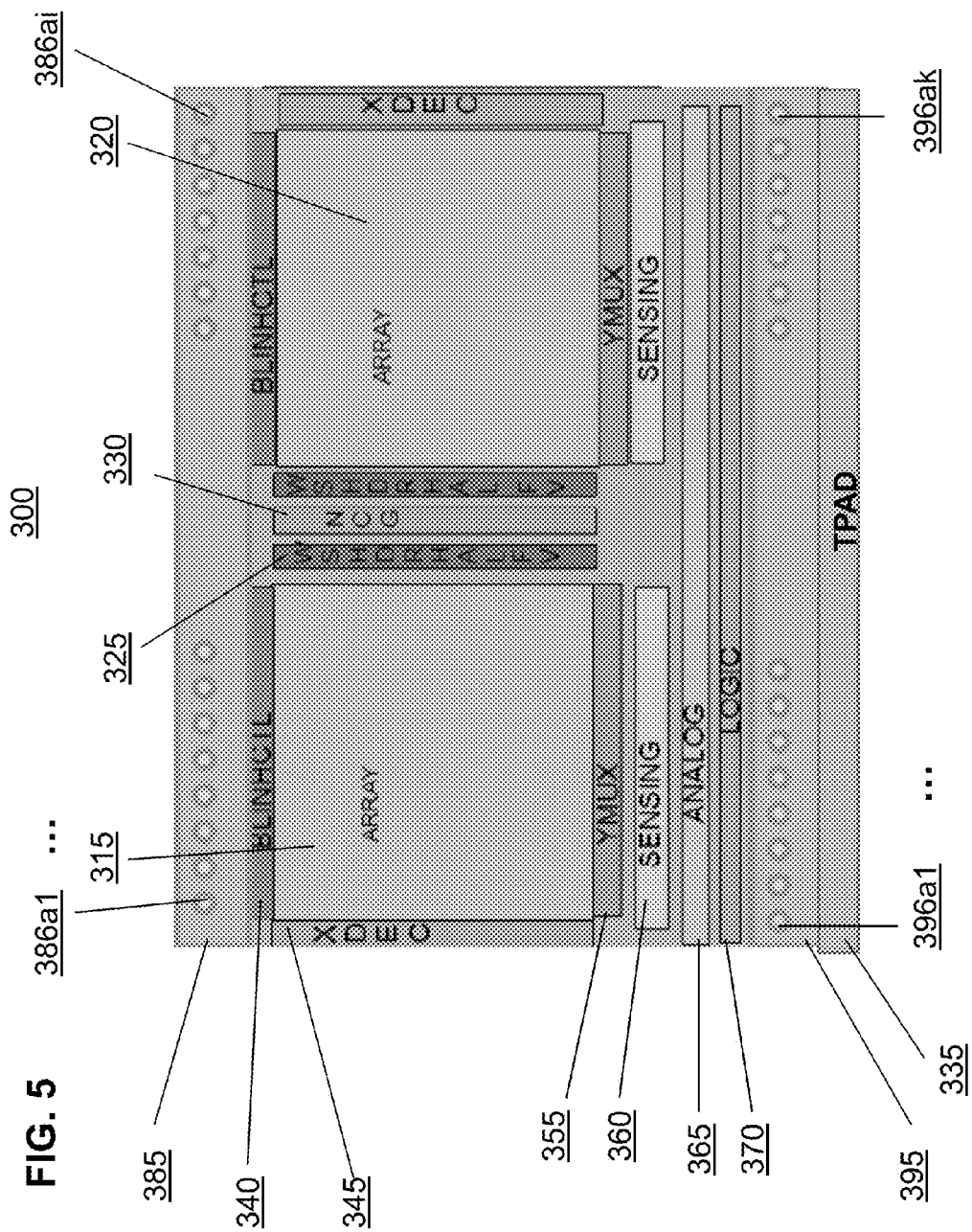
FIG. 5 depicts a first die within another three-dimensional flash memory system embodiment.
Figure 6:
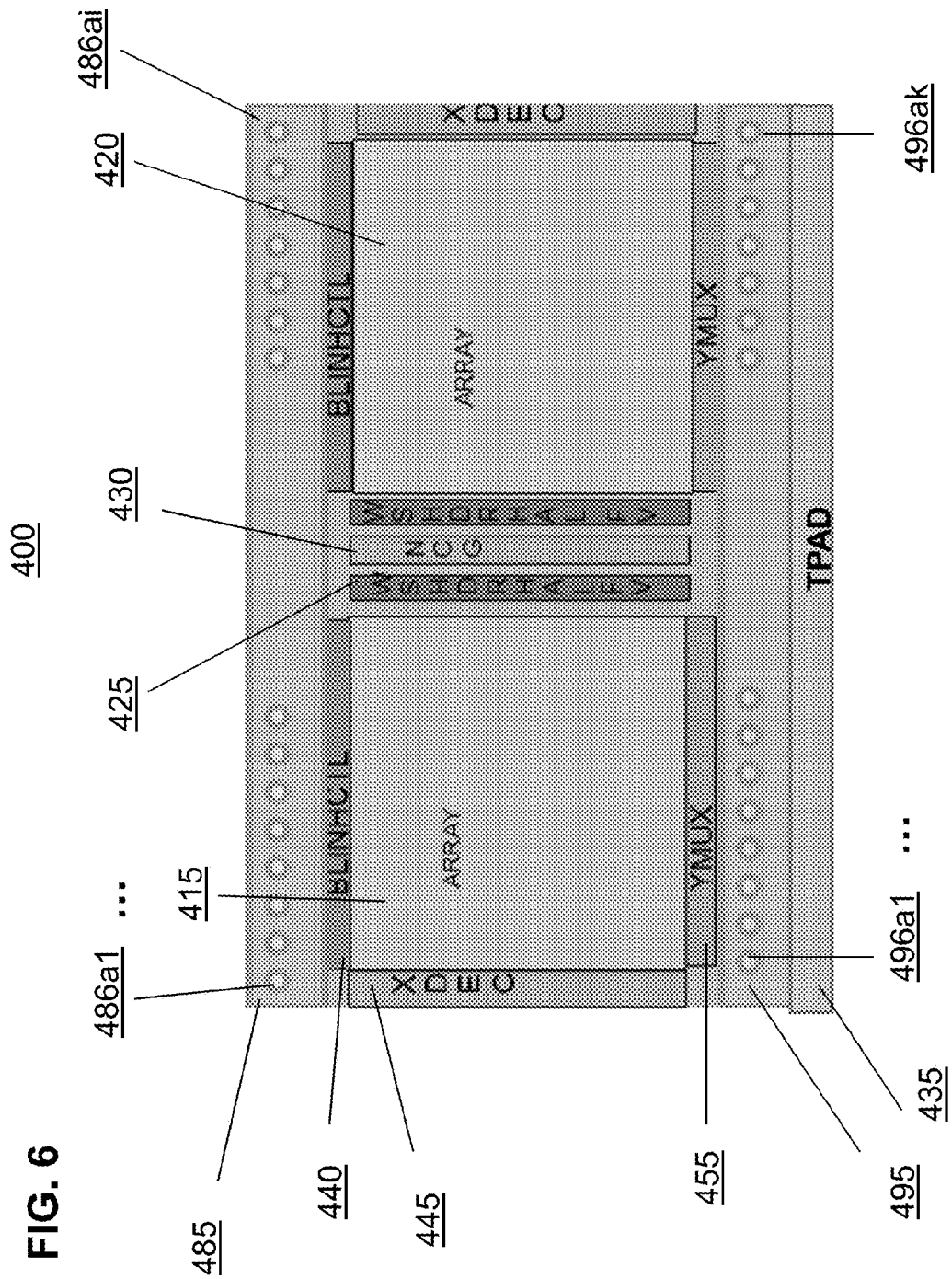
FIG. 6 depicts a second die within a three-dimensional flash memory system embodiment.

FIG. 5 depicts a first die in another embodiment of a three-dimensional flash memory system, and FIG. 6 depicts a second die in that embodiment. Die 300 shown in FIG. 5 is similar to die 100 shown in FIG. 3, except that die 300 does not have a charge pump circuit or high voltage circuit. Die 400 shown in FIG. 6 is similar to die 200 shown in FIG. 4 except that die 400 does not have a sensing circuit. Die 300 and die 400 are coupled via TSV 385 and TSV 395. TSV 385 comprises conductors 386a1 . . . 386ai, and TSV 395 comprises conductors 396a1 . . . 396ak. Optionally, die 315 can be a primary memory array and die 320 a redundant memory array, and/or die 415 can be a primary memory array and die 420 a redundant memory array. Testpads TPAD 335 and 435 are used by a tester to determine if die 300 and die 400 are good dies before 3D stacking.

Figure 7:
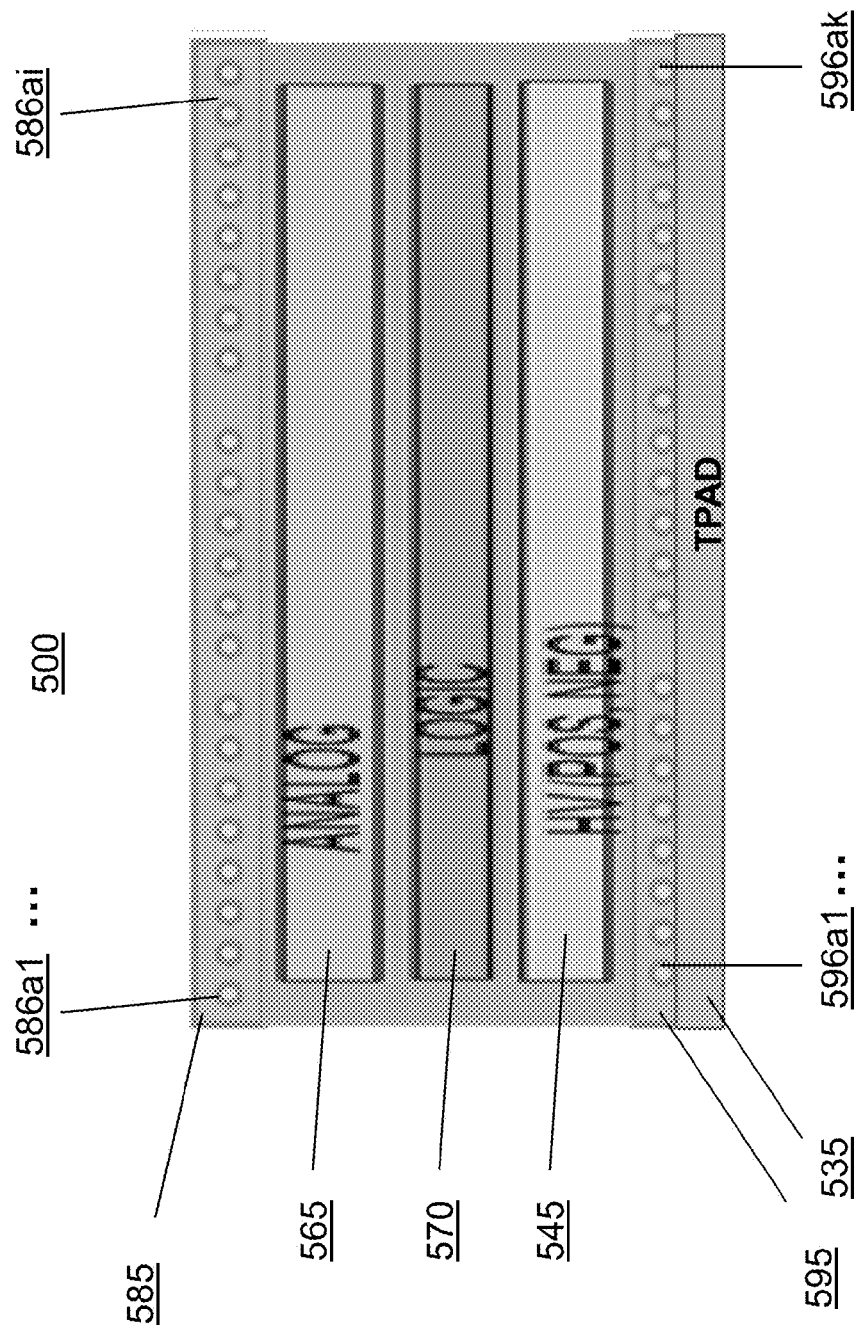
FIG. 7. depicts an optional peripheral flash control die that can be used in a three-dimensional flash memory system embodiment.

FIG. 7 depicts an optional peripheral flash control die for use with any of the embodiments discussed herein. Die 500 contains circuitry for assisting other dies in performing the functions of a flash memory system. Die 500 includes TSV 585, TSV 595 and test pad TPAD 535. TSV 585 comprises conductors 586a1 . . . 586ai, and TSV 595 comprises conductors 596a1 . . . 596ak. Die 500 comprises analog logic 565, control logic 570 and high voltage circuit 545. Die 500 can be used in conjunction with die 200, die 300, and/or die 400 to provide circuit blocks for use with those dies that are not physically present within those dies. This is enabled through TSV 585 and TSV 595. One of ordinary skill in the art will understand that, although numbered differently, TSV 585 and TSV 595 can be the same TSVs described previously with reference to other dies. The testpad TPAD 535 is used by a tester to test die 500 to see if it is a good die before 3D stacking.

Figure 8:
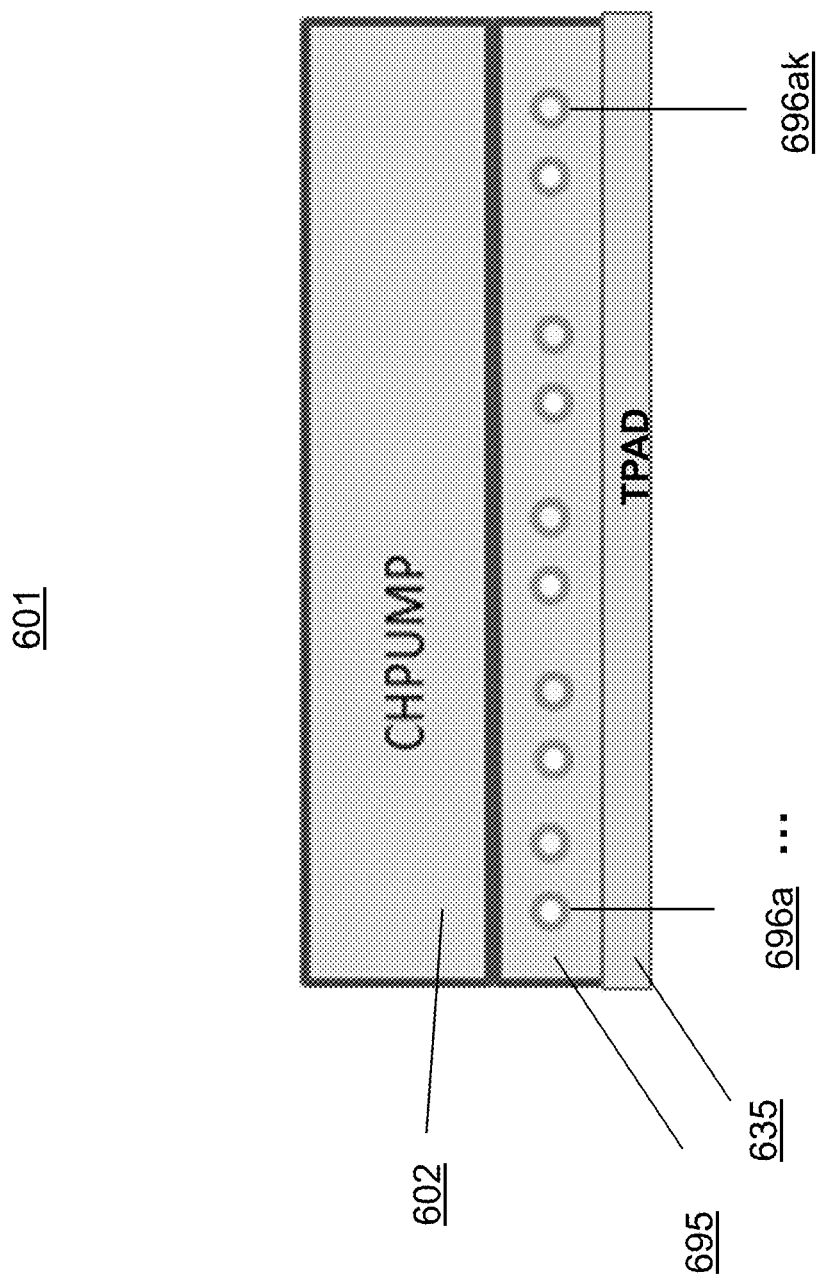
FIG. 8 depicts an embodiment of supplemental circuitry for use with dies containing flash memory arrays.

FIG. 8 depicts a charge pump die for use with any of the embodiments discussed herein. Die 601 contains charge pump circuitry 602 to generate the voltages needed for other dies in performing flash memory erase/program/read operations. Die 601 includes TSV 695. TSV 695 comprises conductors 696a1 . . . 696ak. Die 601 can be used in conjunction with other dies through TSV 695. One of ordinary skill in the art will understand that, although numbered differently, TSV 695 can be the same TSVs described previously with reference to other dies. Testpad TPAD 635 is used by a tester to determine if die 601 is a good die before 3D stacking.

Analog circuits 165, 365, and 565 shown in FIGS. 3, 5, and 7 can provide a multitude of functionality within the memory system, including the following: transistor trimming during the manufacturing process, temperature sensing for the trimming process, timers, oscillators, and voltage supplies.

Sensing circuits 160, 260, and 360 shown in FIGS. 3, 4, and 5 can comprise numerous components used in the sensing operation, including a sense amplifier, transistor trimming circuits (utilizing the trimming information generated by the transistor trimming process performed by analog circuits 165, 365, and/or 565) temperature sensors, reference circuits, and a reference memory array. Optionally, a die can include fewer than all of these categories of circuits. For example, a die might include only a sense amplifier.

Figure 9:
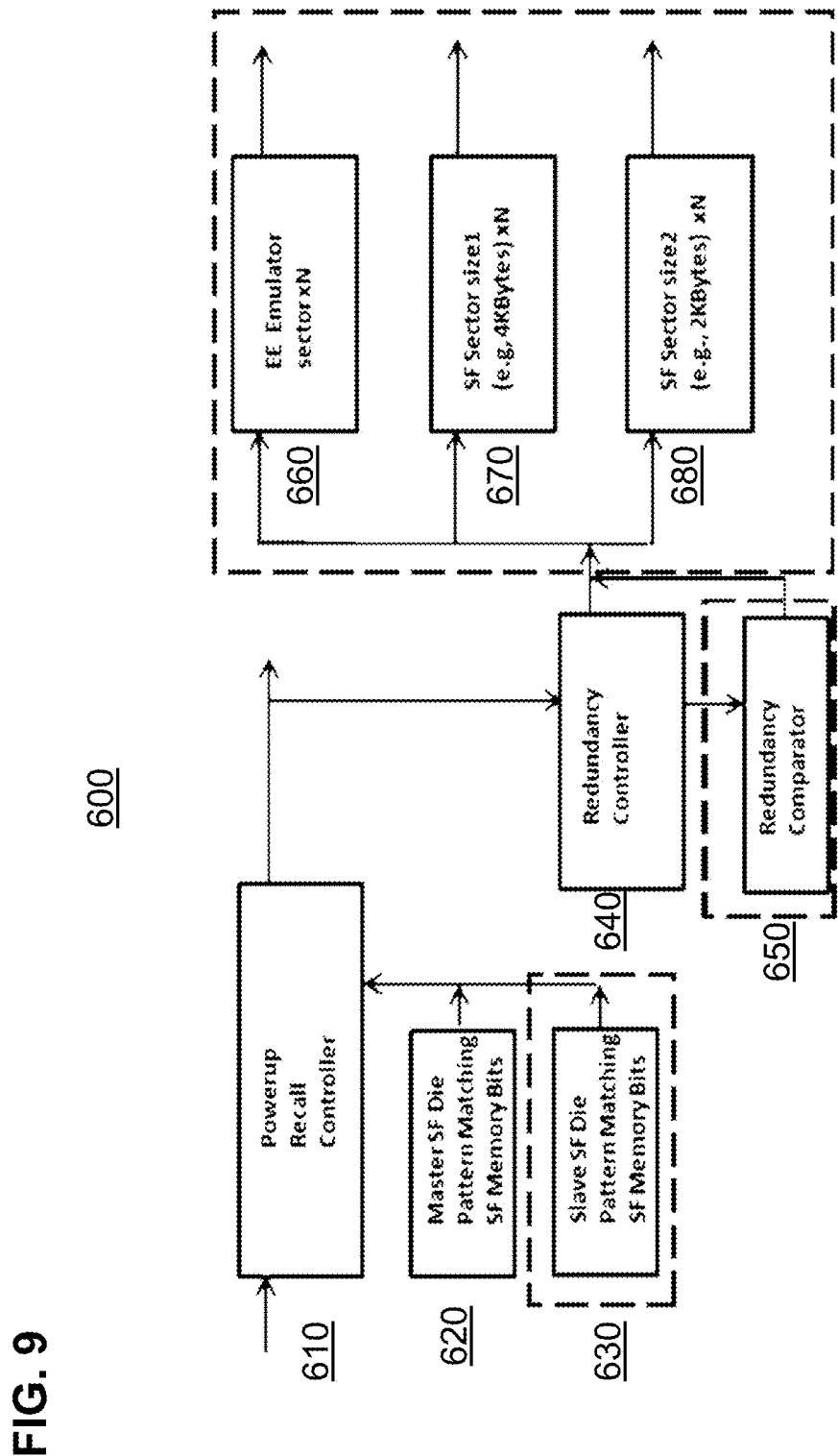
FIG. 9 depicts an embodiment of control circuitry.

FIG. 9 depicts an optional embodiment for control logic 170, 370, and 570, shown as logic block 600. Logic block 600 optionally comprises powerup recall controller 610, First Die Redundancy Circuit 620, Second Die Redundancy Circuit 630, Redundancy Controller 640, Redundancy Comparator 650, EEPROM Emulator 660, Sector Size M Controller 680 and Sector Size N Controller 670.

Powerup recall controller 610 manages the startup of the flash memory system, including performing the built-in self-test functionality. It also fetches the configuration data for transistor trimming that was generated during the manufacturing process.

First Die Control Circuit 620 stores a list of memory cells in the arrays located in a first die that are determined during power up or operation to be faulty or subject to error. First Die Control Circuit 620 stores this information in non-volatile memory. First Die Control Circuit 620 also stored transistor trimming data generated during the manufacturing and testing phase. Upon power up, powerup recall controller 610 will retrieve the list of bad memory cells from First Die Control Circuit 620, and Redundancy Controller 640 thereafter will map the bad storage cells to addresses for redundant (and good) cells, so that all accesses to the bad cells will instead be directed to good cells.

First Die Control Circuit 620 also stores trimming data for a first die that was generated during the manufacturing or testing process. Transistor trimming techniques to compensate for manufacturing variability in integrated circuits are known in the art.

First Die Control Circuit 620 also performs built-in self-tests. One type of test is disclosed in U.S. application Ser. No. 10/213,243, U.S. Pat. No. 6,788,595, "Embedded Recall Apparatus and Method in Nonvolatile Memory" (the "'595 patent") assigned to a common assignee, which is hereby incorporated by reference. The '595 patent discloses the storage of a pattern of predetermined bits in a memory array and in a register. During the startup process, the bits from the memory array are compared to the bits in the register. This process is repeated until a set number of "passes" or "failures" occurs. The purpose of this test is to validate different portions of the memory array. If any failures are identified, then the relevant cells can be added to the list of "bad" cells.

Second Die Control Circuit 630 performs the same function as First Die Redundancy Circuit 620 but for a second die. One of ordinary skill in the art will understand that a Control Circuit such as First Die Control Circuit 620 and Second Die Control Circuit 630 can be used for each additional die in the memory system.

Redundancy controller 640, already discussed above, maps bad storage cells to addresses for good storage cells, so that the bad storage cells are no longer used during normal operation. Redundancy comparator 650 compares in real time incoming address versus bad addresses stored to determine if addressed storage cells needs to be replaced. Optionally, redundancy controller 640 and redundancy comparator 650 can be shared by more than one die.

EE Emulator Controller 660 enables the memory system to emulate an EEPROM. For example, EEPROMs typically utilize memory of a certain sector size of a small number of bytes, such as 8 bytes (or 16,32,64 bytes) per sector. A physical flash memory array will contain thousands of rows and columns. EE Emulator controller 660 can divide an array into groups of 8 or 64 bytes (or whatever the desired sector size is) and can assign sector numbers to each set of 8 or 64 bytes. Thereafter, EE emulator controller 660 can receive commands intended for an EEPROM and can perform read or write operations to the flash array by translating the EEPROM sector identifiers into row and column numbers that can be used with an array within a die. In this manner, the system emulates the operation of an EEPROM.

Sector Size N Controller 670 enables the memory system to operate on sectors of size N bytes. Sector Size N Controller 670 can divide an array into sets of N bytes and can assign sector numbers to each set of N bytes. Thereafter, Sector Size N Controller 670 can receive commands intended for one or more sectors of size N bytes, and the system can perform read or write operations accordingly by translating the sector identifiers into row and column numbers that can be used with an array within a die.

Sector Size M Controller 680 enables the memory system to operate on sectors of size M bytes. Sector Size M Controller 680 can divide an array into sets of M bytes and can assign sector numbers to each set of M bytes. Thereafter, Sector Size M Controller 680 can receive commands intended for one or more sectors of size M bytes, and the system can perform read or write operations accordingly by translating the sector identifiers into row and column numbers that can be used with an array within a die.

One of ordinary skill in the art will appreciate that numerous sector size controllers can be utilized to emulate sectors of various sizes.

One advantage of the disclosed embodiments is the ability to handle read and write requests to sectors of different sizes. For example, one array can be dedicated to handling read and write requests to sectors with a size of 2K bytes per sector, and another array can be dedicated to handling read and write requests to sectors with a size of 4K bytes per sector. This will allow a single flash memory system to emulate multiple types of legacy memory systems, such as RAM, ROM, EEROM, EEPROM, EPROM, hard disk drives, and other devices.

Another advantage of the disclosed embodiments is that different dies can be fabricated using different processes. For example, die 100 can be fabricated using a first semiconductor process, such as 40 nm, and die 200 can be fabricated using a second semiconductor process, such as 65 nm. Because die 500 does not contain any memory arrays, it optionally can be fabricated using a semiconductor process optimized for analog logic, such as 130 nm.

Figure 10:
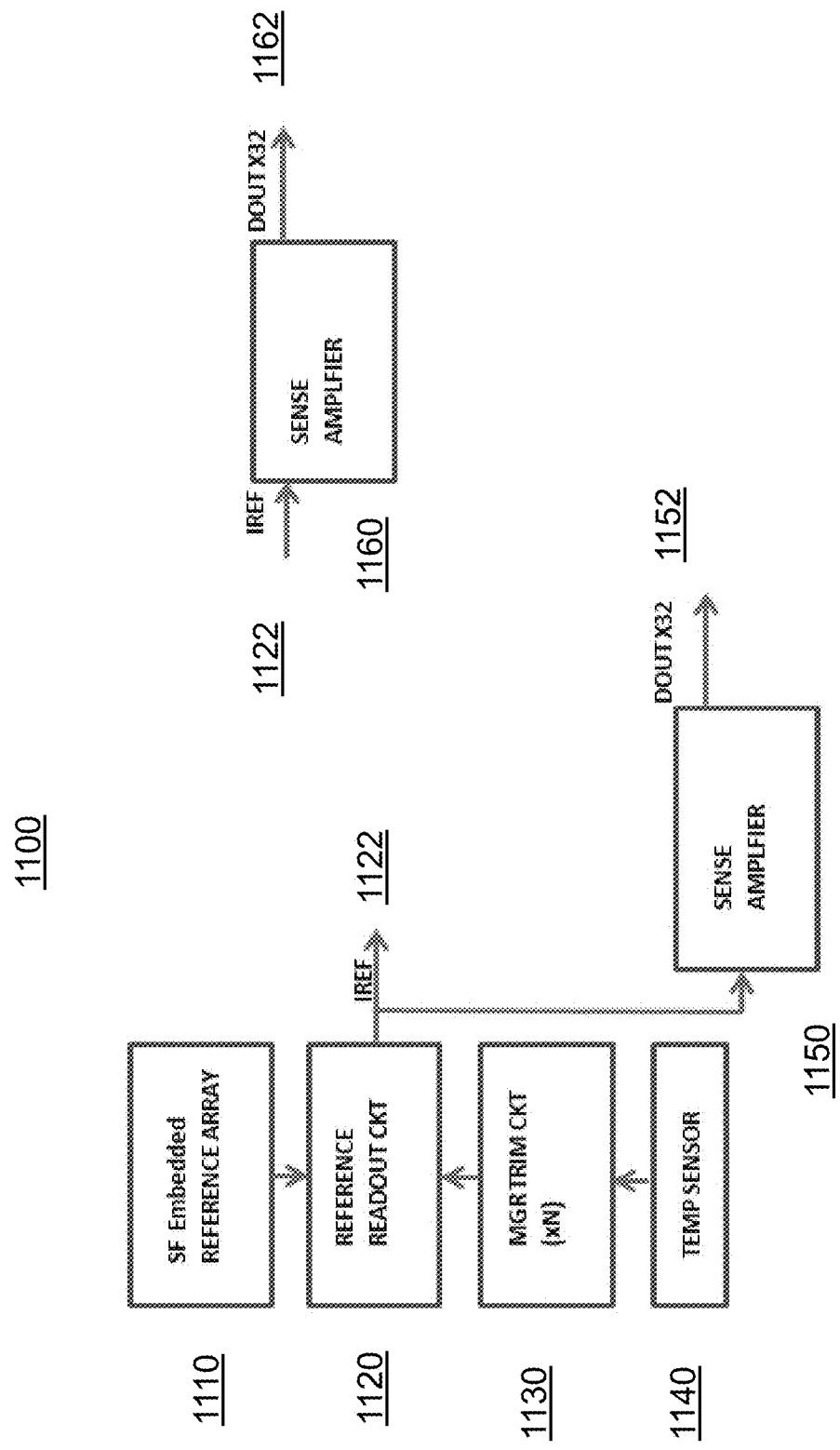
FIG. 10 depicts a sensing system that can be used in a three-dimensional flash memory system embodiment.

FIG. 10 depicts a sensing system 1100 that can be used in the three-dimensional flash memory system embodiments described herein. The sensing system 1100 comprises SF (SuperFlash split gate technology, such as the memory cell as described in FIG. 1) Embedded Reference Array 1110, Reference Readout Circuit 1120, Read Margin Trim Circuit 1130, Temperature Sensor 1140, Sense Amplifier 1150, and Sense Amplifier 1160. In one embodiment, Sense Amplifier 1160 is implemented on die 200 and 300, and the rest of circuit blocks shown in FIG. 10 are implemented on die 100.

The SF Embedded Reference Array 1110 provides the reference cell needed to generate reference levels to be compared against the data level (generated from a data memory cell). The reference level is generated by the Reference Readout Circuit 1120. The comparison is done by the Sense Amplifier 1150, and its output signal is DOUT 1152. The Read Margin Trim Circuit 1130 is used to adjust the reference level to different levels needed to ensure data memory cell integrity against PVT (process, voltage, and temperature) variations and stress conditions. The Temperature Sensor 1140 is needed to compensate for temperature gradient for different dies in the vertical die stacking in the three-dimensional flash memory system. Because the circuit blocks 1110, 1120, 1130, 1140 are manufactured on one master die (e.g., die 100), less overhead and power is needed for the three-dimensional flash memory operation. This sensing architecture saves power and area without sacrificing performance.

Figure 11:
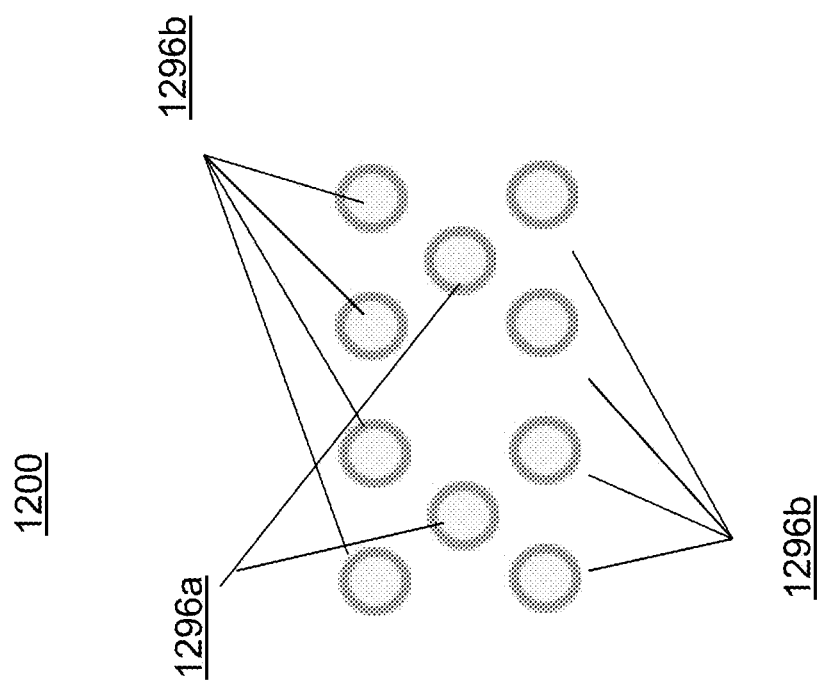
FIG. 11 depicts a TSV design that can be used in a three-dimensional flash memory system embodiment.

FIG. 11 depicts a TSV shield design 1200 for critical signals to minimize noise impact. The 1200 TSV shield design includes TSV 1296a for critical signals such for routing read signal paths such as for signal 1122 IREF and signal 1152 DOUTx in FIG. 10 or for signals such as for output of the sensing 160 in FIG. 4 or the signal of block 455 in FIG. 6. Other critical signals include address lines, clocks, and control signals. The TSV 1296b serves as shielding signal lines for the TSV 1296a to minimize cross talk from other signals to the TSV 1296a as well as prevent noise projected from the TSV 1296a to other TSV.

Figure 12:
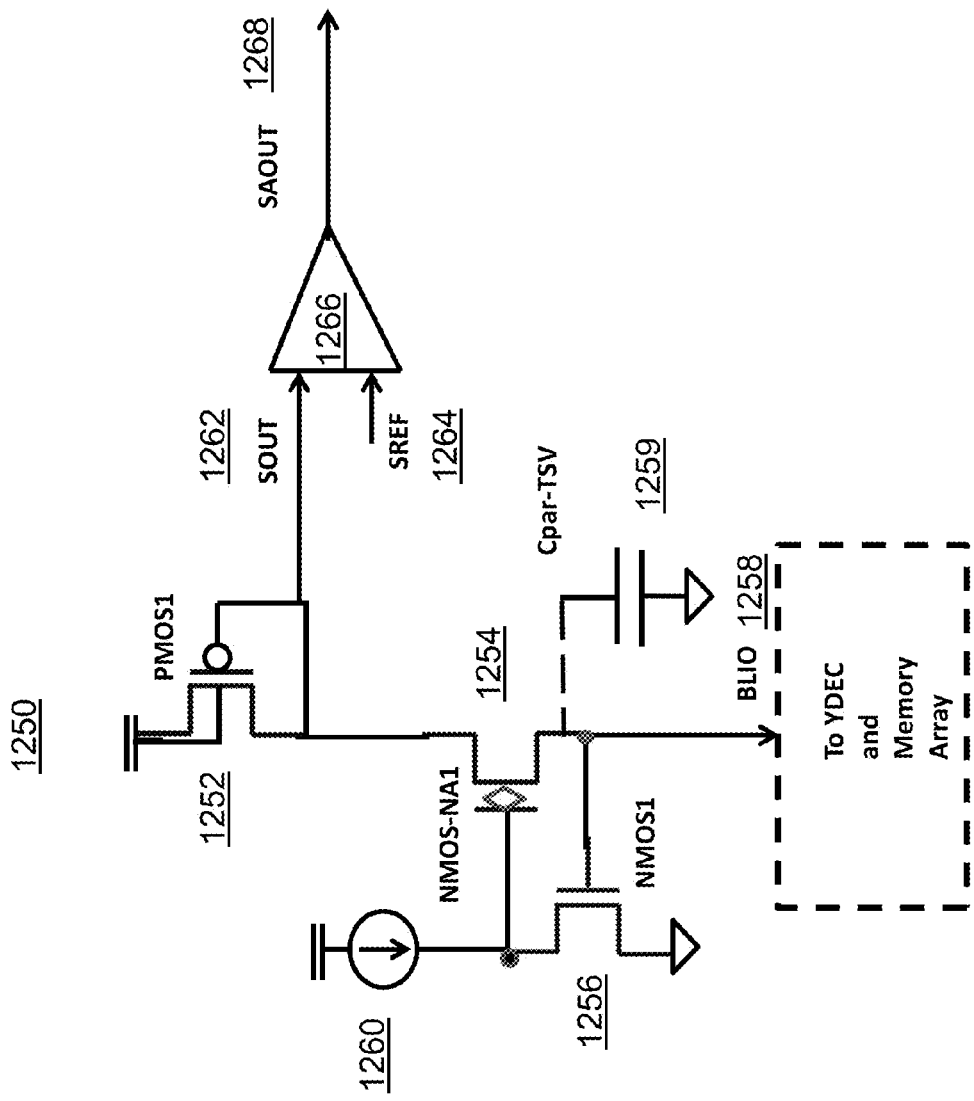
FIG. 12 depicts a sensing circuit design that can be used in a three-dimensional flash memory system embodiment.

FIG. 12 depicts a sensing circuit 1250 that can be used in the three-dimensional flash memory system embodiment. The sensing circuit 1250 includes load (pullup) PMOS transistor 1252, a cascoding native NMOS transistor 1254 (with a threshold voltage ~0V), a bitline bias NMOS transistor 1256, and a bitline bias current source 1260. Alternatively the load PMOS transistor 1252 can be replaced with a current source, a native NMOS transistor, or a resistor. Alternatively instead of the current source 1260 and the NMOS transistor 1256, a bias voltage on the gate of the NMOS transistor 1254 can be used to determine the bias voltage on the bit line BLIO 1258. Bit line BLIO 1258 (source of NMOS 1254) couples to a memory cells through a y-decoder and a memory array (similar to ymux 255 and array 215 in FIG. 4, for example). A sensed node SOUT 1262 couples to a differential amplifier 1266. A reference SREF 1264 couples to another terminal of the differential amplifier 1266. A senseamp output SAOUT 1268 is output of differential amplifier 1266. As partitioned, the sensing circuit 1250 is used to drive a TSV parasitic capacitor 1259 (which comes from a TSV used to connect a die to next die in the 3D stack) through the cascoding transistor 1254. Such arrangement minimizes the sensing speed penalty since the sensed node SOUT 1262 does not see the TSV parasitic capacitor 1259 directly.

Figure 13:
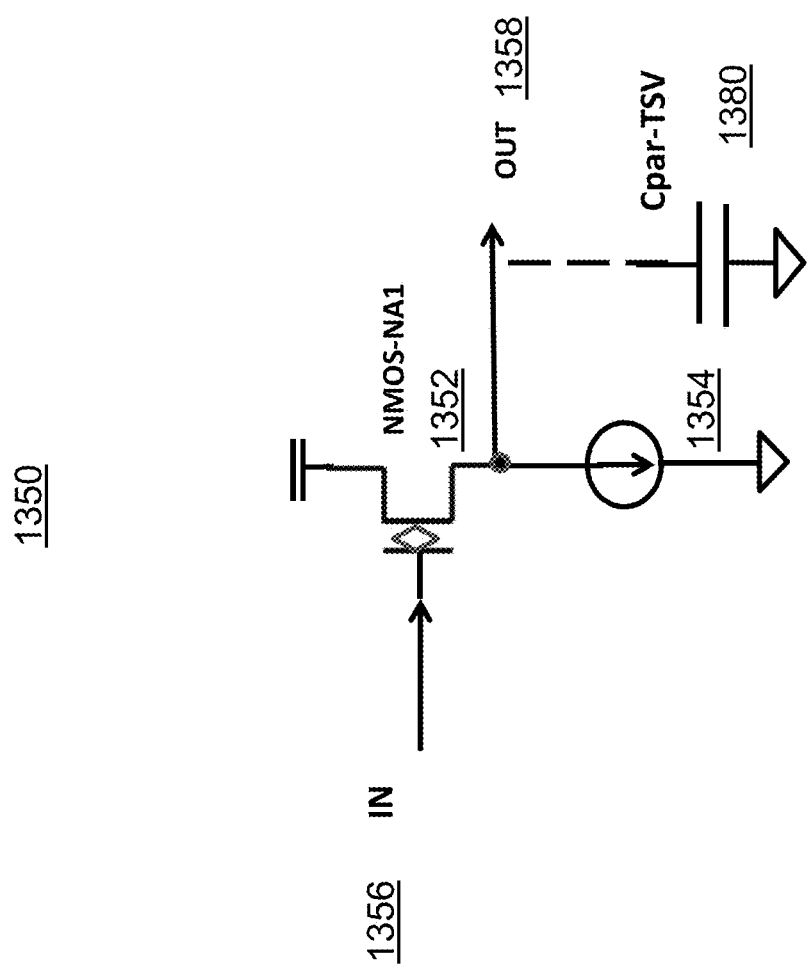
FIG. 13 depicts a source follower TSV buffer circuit design that can be used in a three-dimensional flash memory system embodiment.

FIG. 13 depicts a source follower TSV buffer circuit 1350 that can be used in the three-dimensional flash memory system embodiments. The source follower TSV buffer 1350 is used to drive a TSV connection. The TSV buffer includes a native (threshold voltage ~0V) NMOS transistor 1352 and a current source 1354. The circuit 1350 is used in one embodiment at the output of the sensing circuit 160 (FIG. 3), the sensing circuit 260 (FIG. 4), the ymux circuit 455 (FIG. 6) to drive a TSV across the die stack. The circuit 1350 can also be used for other analog signals such as bandgap reference voltage.

Figure 14:
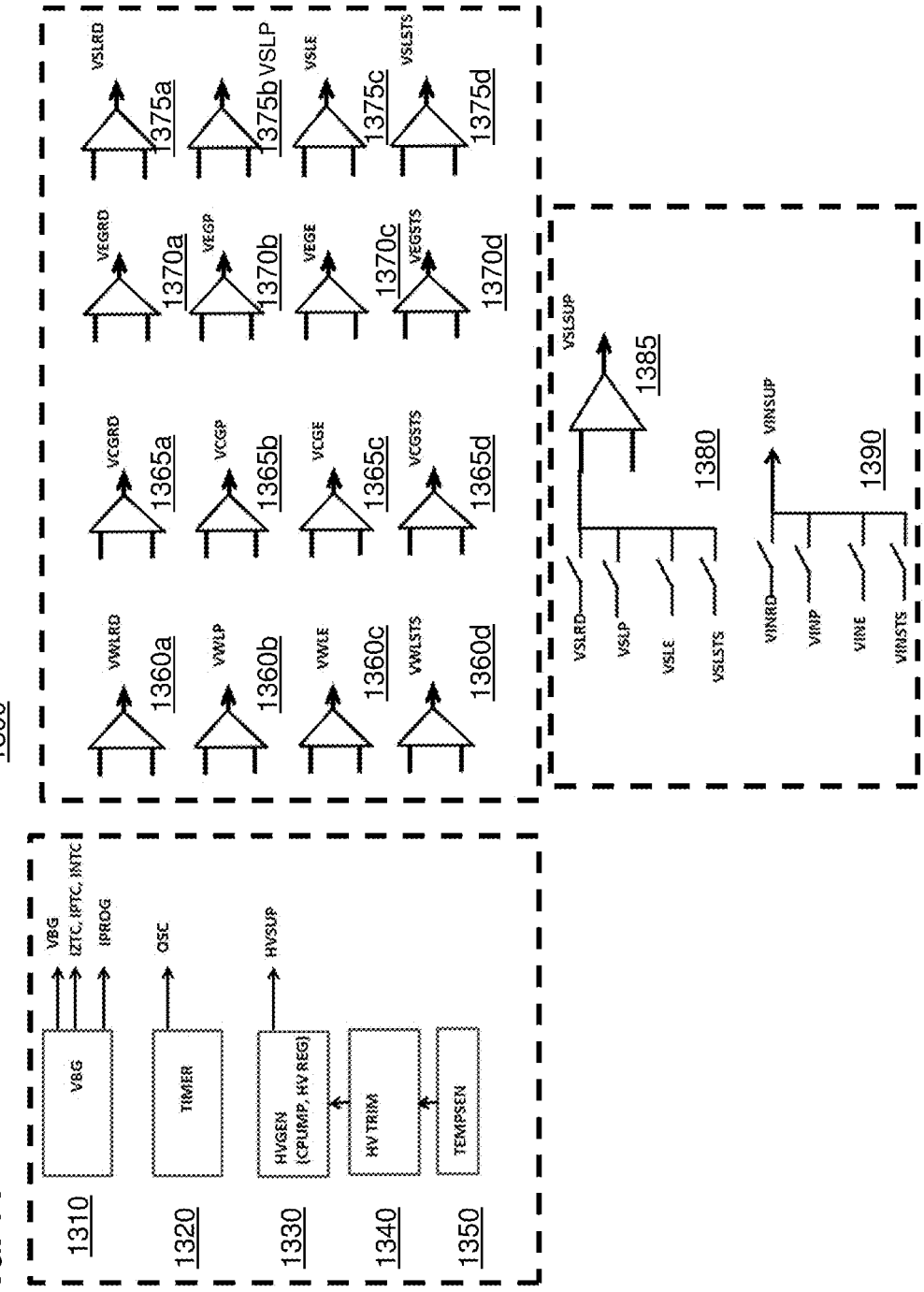
FIG. 14 depicts a high voltage circuit design that can be used in a three-dimensional flash memory system embodiment.

FIG. 14 depicts an analog high voltage (HV) system 1300 that can be used in the three-dimensional flash memory system embodiment. The analog HV system 1300 includes a bandgap reference block 1310, a timer block 1320, a high voltage generation HVGEN 1330, a HV trimming HV TRIM 1340, and a temperate sensing block TEMPSEN 1350. The TEMPSEN 1350 is used to compensate the temperature gradient of the 3D die stack by adjusting the high voltage depending on each die temperature. The HV TRIM 1340 is used to trim the high voltage levels to compensate the process variation of each die in the stack.

The analog HV system 1300 also includes analog HV level wordline driver 1360a-d for VWLRD/VWLP/VWLE/VWLSTS (wordline read/program/erase/stress) respectively. The analog HV system 1300 also includes analog HV level control gate driver 1365a-d for VCGRD/VCGP/VCGE/VCGSTS (control gate read/program/erase/stress) respectively. The analog HV system 1300 also includes analog HV level erase gate driver 1370a-d for VEGRD/VEGP/VEGE/VEGSTS (erase gate read/program/erase/stress) respectively. The analog HV system 1300 also includes analog HV level source line driver 1375a-d for VSLRD/VSLP/VSLE/VSLSTS (source line read/program/erase/stress) respectively. The analog HV system 1300 also includes analog HV level driver 1390 for muxing the input level VINRD/VINP/VINE/VINSTS (input line read/program/erase/stress) respectively. The analog HV system 1300 also includes analog HV level driver 1380 for muxing the input level VSLRD/VSLP/VSLE/VSLSTS (input line read/program/erase/stress) respectively to input of a source line supply circuit 1385 VSLSUP.

In one embodiment, circuit blocks 1310-1350 are implemented on a master SF die 100 (FIG. 3) or on a peripheral flash control die 500 (FIG. 7). In another embodiment, circuit blocks 1360a-d/1365a-d/1370a-d/1375a-d are implemented on a master flash die such as die 100 (FIG. 3) or on a peripheral flash control die 500 (FIG. 7). In another embodiment, circuit blocks 1380/1385/1390 are implemented on a slave flash die such as die 300 (FIG. 5).

Figure 15:
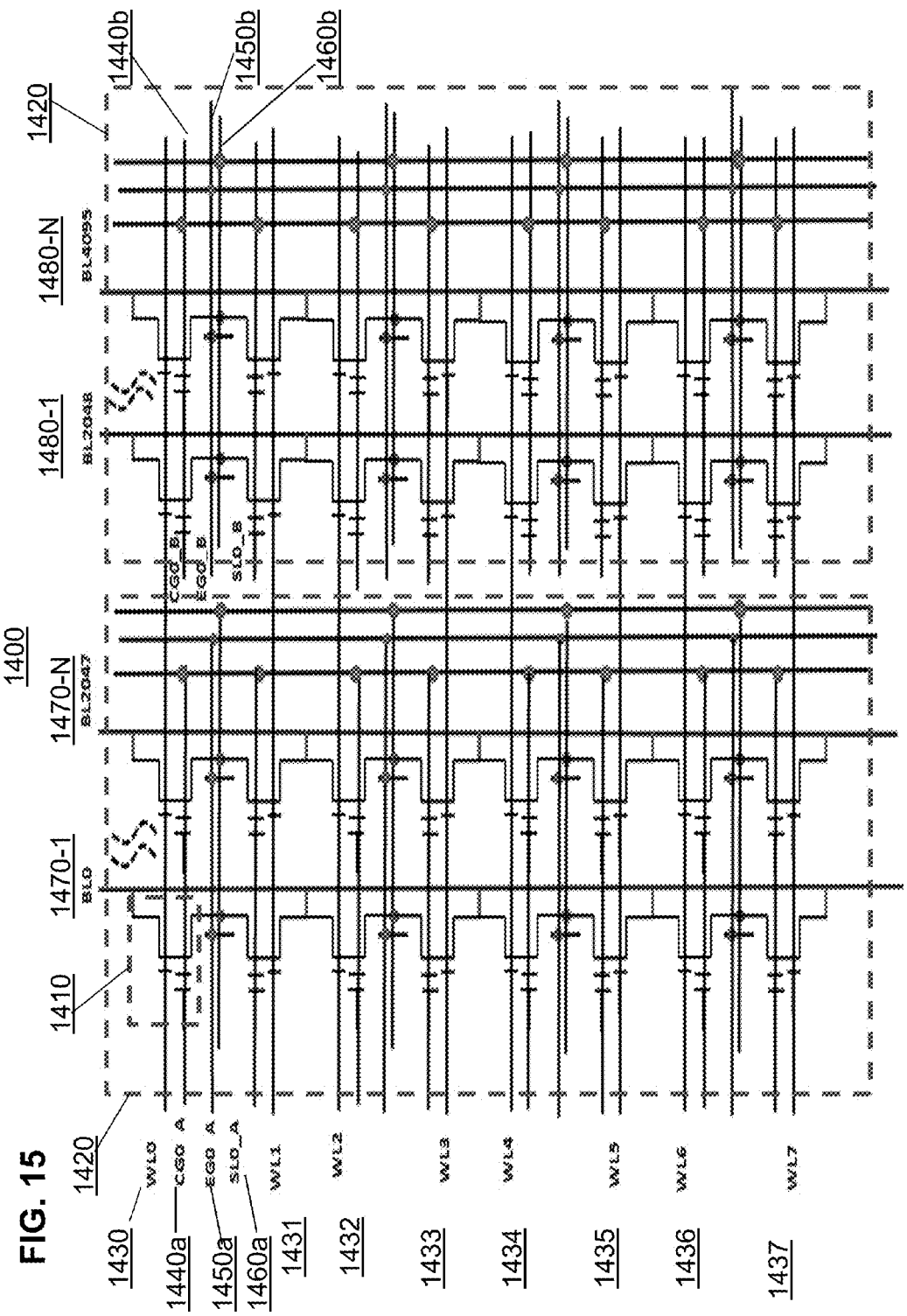
FIG. 15 depicts a flash memory sector architecture that can be used in a three-dimensional flash memory system embodiment.

FIG. 15 depicts an flash memory sector architecture 1400 that can be used in the three-dimensional flash memory system embodiment. The sector architecture 1400 includes multiple memory cells 1410 that is arranged into bitlines (columns) and rows. The memory cell 1410 is as the memory cell 10 in FIG. 1. The sector architecture includes a flash sector 1420 that includes 8 wordlines WL0-7 1430-1437, 2K bitlines 0-2047 1470-1 to 1470-N, one CG line 1440a (connecting all CG terminal of all memory cells 1410 in sector 1420), one SL line 1460a (connecting all SL terminal of all memory cells 1410 in sector 1420), one EG line 1450a (connecting all EG terminal of all memory cells 1410 in sector 1420). As such there are 2K bytes of memory cells 1410 in the sector 1420. Different number of bytes per sector can be implemented by using more or less number of wordline and more or less number of bitlines such as 8 wordlines and 4K bitlines (4K bytes per sector). Multiple of sector 1420 can be arranged horizontally with all wordlines shared horizontally across. Multiples of sectors 1420 can be tiled vertically to increase the array density with all bitlines shared vertically.

Figure 16:
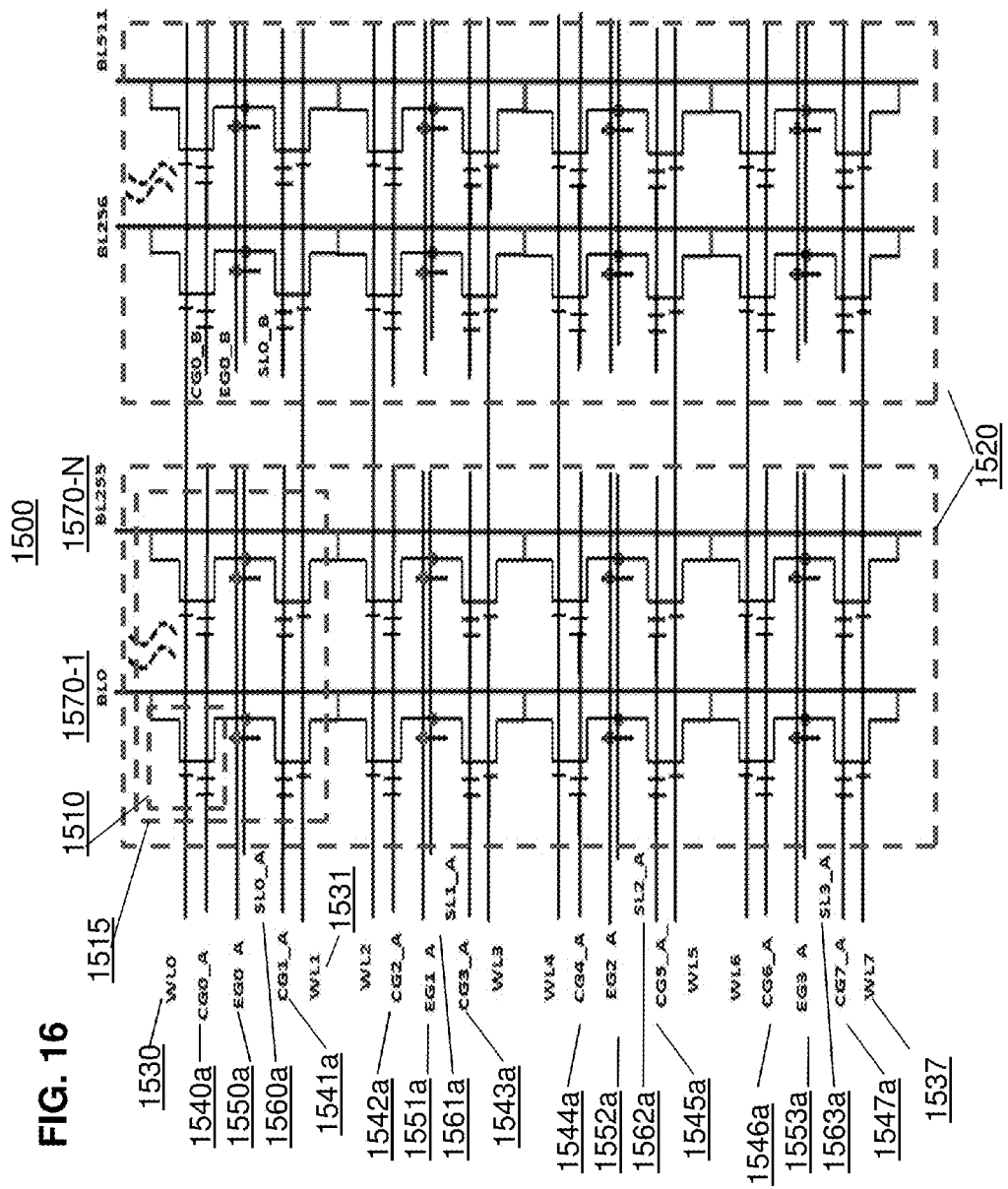
FIG. 16 depicts an EEPROM emulator memory sector architecture that can be used in a three-dimensional flash memory system embodiment.

FIG. 16 depicts an EE emulator sector architecture 1500 that can be used in the three-dimensional flash memory system embodiment. The sector architecture 1500 includes multiple memory cells 1510 that is arranged into bitlines (columns) and rows. The memory cell 1510 is as the memory cell 10 in FIG. 1. The EE emulator sector architecture includes a flash EE emulator sector 1515 that includes 2 wordlines WL0-1 1530-1531, 256 bitlines 0-255 1570-1 to 1570-N, one CG line 1540a (connecting all CG terminal of all memory cells 1510 in sector 1515), one SL line 1560a (connecting all SL terminal of all memory cells 1510 in sector 1515), one EG line 1550a (connecting all EG terminal of all memory cells 1510 in sector 1515). As such there are 64 bytes of memory cells 1510 in the EE emulator sector 1515. Smaller number of bytes per EE emulator sector can be implemented by using less number of wordline and less number of bitlines, such as 1 wordline and 64 bitlines (8 bytes per EE emulator sector). The flash EE emulator sector 1515 is tiled vertically to make up a plane array 1520 with all bitlines shared vertically. The plane array 1520 is tiled horizontally to make multiples of it will all wordlines are shared horizontally.

Figure 17:
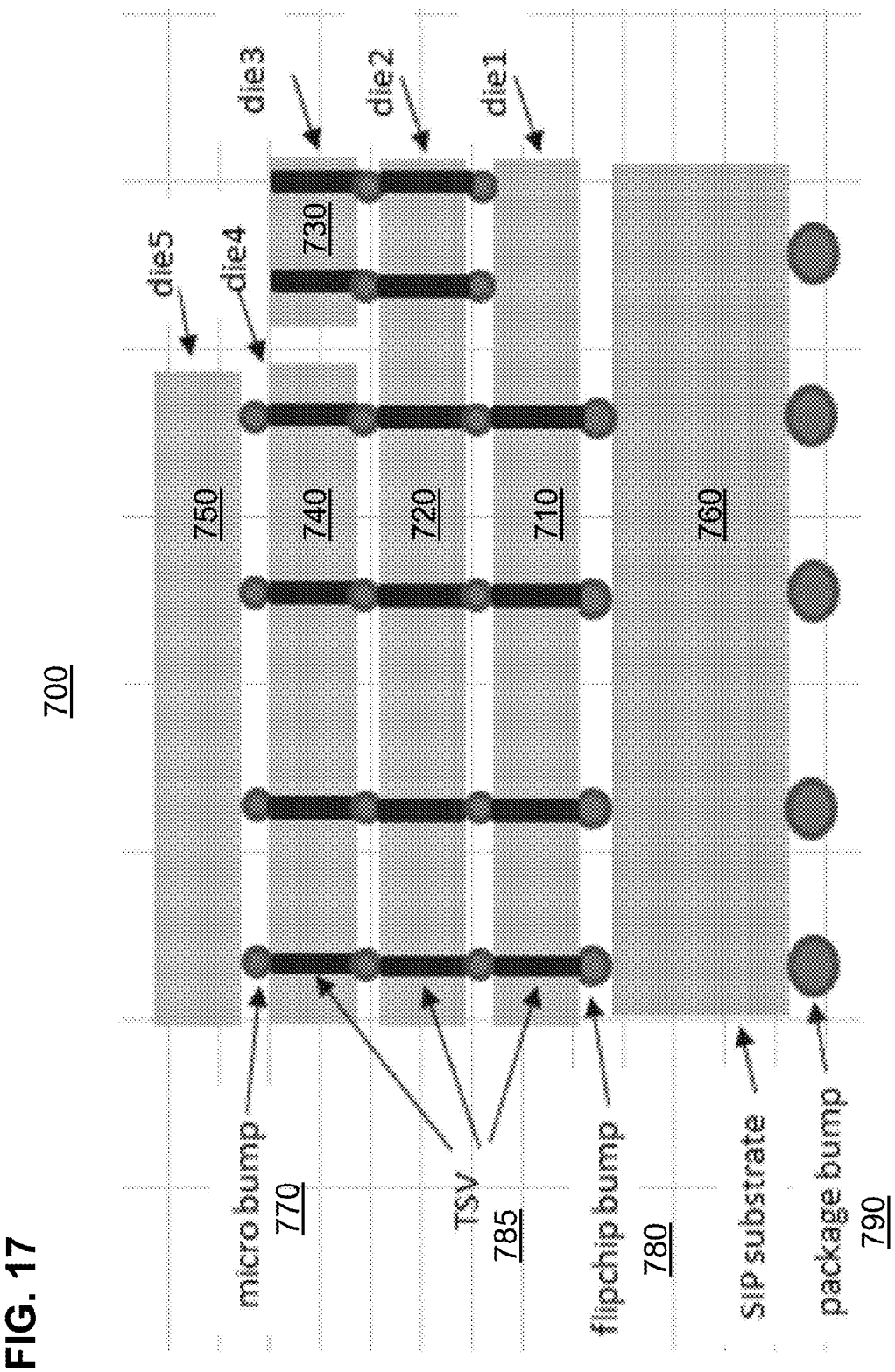
FIG. 17 depicts another embodiment of a three-dimensional flash memory system.

Another embodiment is shown in FIG. 17. Integrated circuit 700 comprises a plurality of dies. In this example, integrated circuit 700 comprises die 710, die 720, die 730, die 740, and die 750. Die 710 is mounted on substrate 760 using flipchip connections 780. The substrate 760 connects to package bumps 790, which can be used by devices outside of integrated circuit 700 to access integrated circuit 700. TSV 785 connects different dies together. A first subset of TSV 785 connects die 710, die 720, die 740, and die 750 together, and a second subset of TSV 785 connects due 710, die 720, and die 730 together. Within TSV 785 are microbumps 770 used to connect to dies. Die 730 and die 740 are located within the same "level" or dimension within integrated circuit 700.

In one example based on this embodiment, the die 710 is a MCU (microcontroller) die, CPU (Central Processing Unit) die, or a GPU (Graphics Processing Unit) die, die 720 is a master flash die, die 740 is a slave flash die, die 750 is a RAM die, and die 730 is peripheral flash control die or a charge pump die.

Another advantage of the disclosed embodiments is that different dies can be fabricated using different processes. For example, die 710 can be fabricated using a first semiconductor process, such as 14 nm, and die 720/740 can be fabricated using a second semiconductor process, such as 40 nm. Because die 730 does not contain any memory arrays, it optionally can be fabricated using a semiconductor process optimized for analog logic, such as 65 nm.

Figure 18:
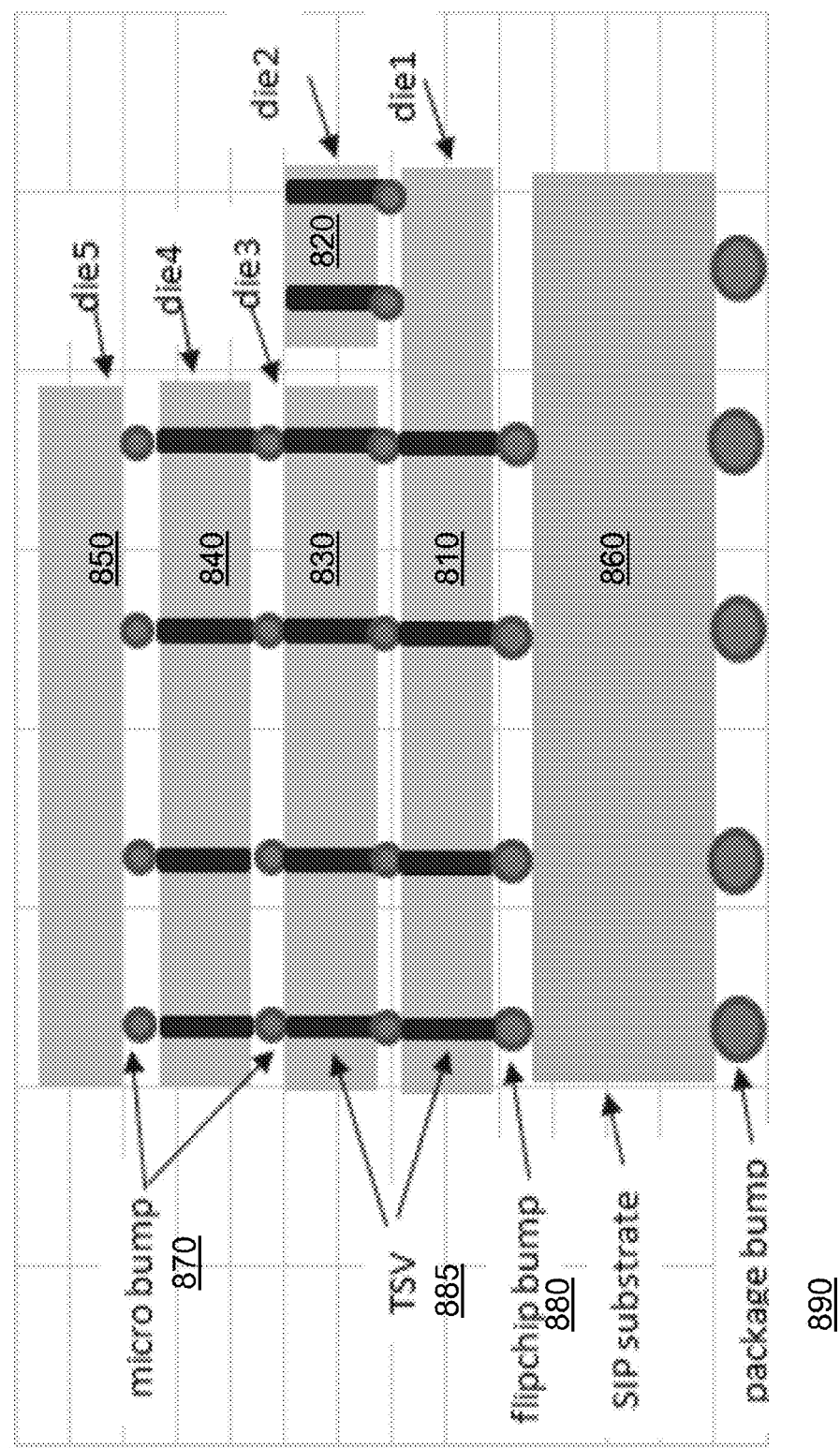
FIG. 18 depicts another embodiment of a three-dimensional flash memory system.

Another embodiment is shown in FIG. 18. Integrated circuit 800 comprises a plurality of dies. In this example, integrated circuit 800 comprises die 810, die 820, die 830, die 840, and die 850. Die 810 is mounted on substrate 860 using flipchip connections 880. The substrate 860 connects to package bumps 890, which can be used by devices outside of integrated circuit 800 to access integrated circuit 800. A subset of TSV 885 connects die 810, die 830, die 840, and die 850 together, and a second subset of TSV 885 connects die 810 and die 820 together. Within TSV 885 are microbumps 870 used to connect to dies.

In one example based on this embodiment, die 810 is a master flash die, die 830/840/850 are slave flash dies, and die 820 is peripheral flash control die or a charge pump die.

Figure 19:
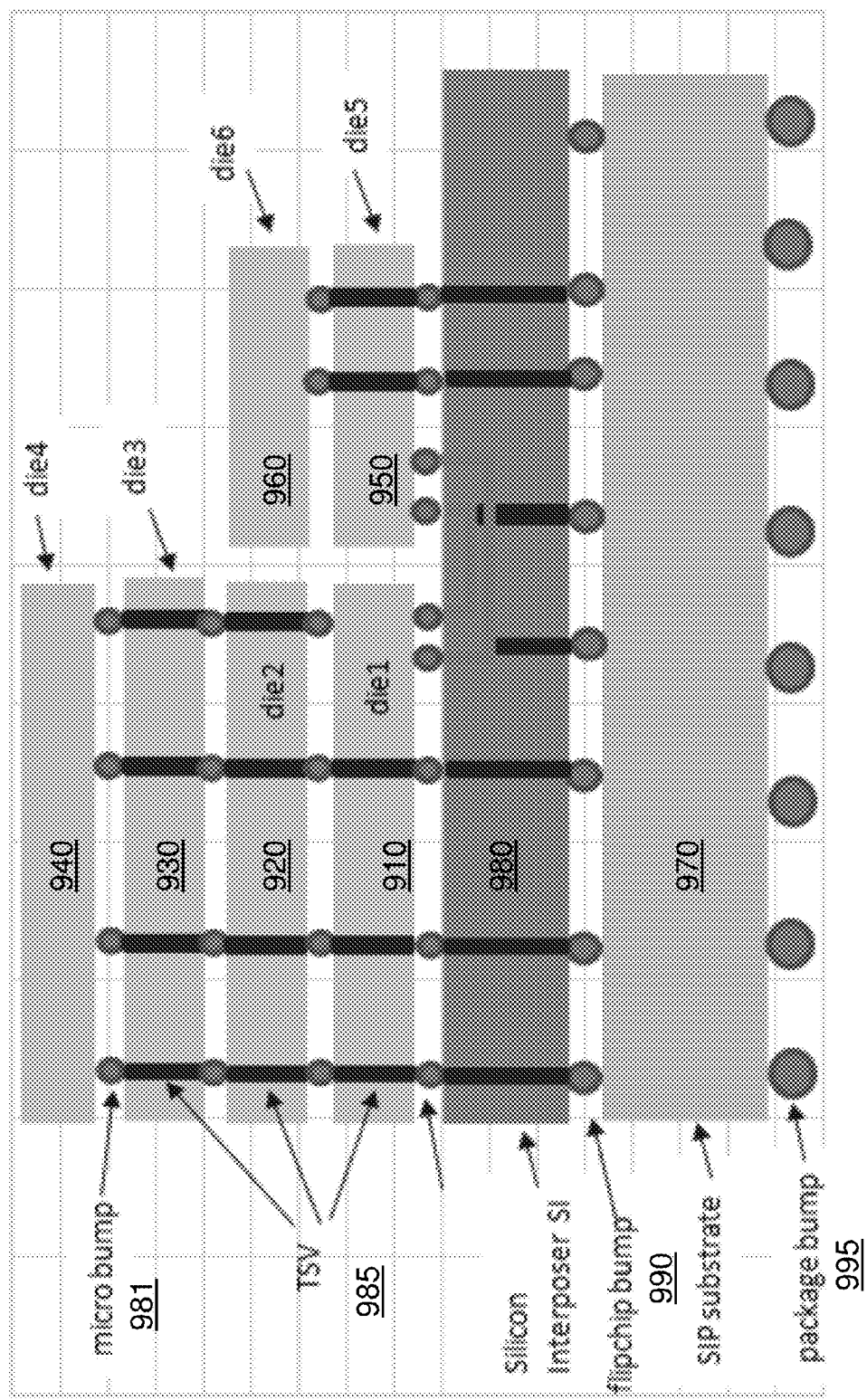
FIG. 19 depicts another embodiment of a three-dimensional flash memory system.

Another embodiment is shown in FIG. 19. Integrated circuit 900 comprises a plurality of dies. In this example, integrated circuit 900 comprises die 910, die 920, die 930, die 940, die 950, and die 960. Die 910 and 950 are mounted on substrate 970 using flipchip connections 990. The die 910 and 950 are connected together through a silicon interposer 980. The substrate 970 connects to package bumps 995, which can be used by devices outside of integrated circuit 900 to access integrated circuit 900. A first subset of TSV 985 connects die 910, die 920, die 930, and die 940 together, and a second subset of TSV 985 connects die 950 and die 960 together. Within TSV 985 are microbumps 981 to connect to dies.

In one exampled based on this embodiment, the die 910 is a master flash die, die 920/930/940 are slave flash dies, and die 950/960 are peripheral flash control dies.

Figure 20:
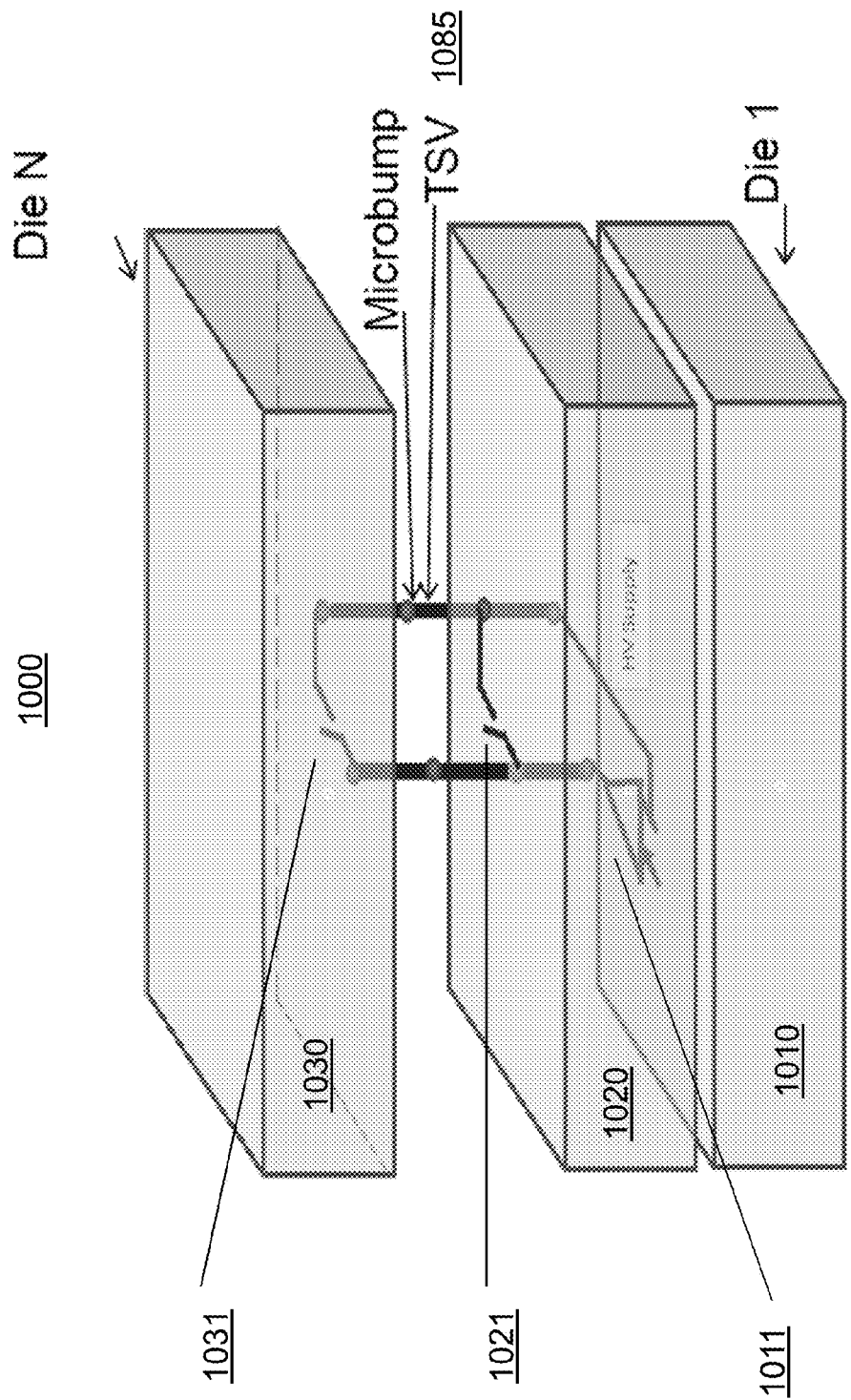
FIG. 20 depicts an embodiment of a high voltage supply within a three-dimensional flash memory system.

An embodiment of a force-sense high voltage supply is shown in FIG. 20. Integrated circuit 1000 comprises a plurality of dies. In this example, integrated circuit 1000 comprises die 1010, die 1020, through die 1030 (with any number of dies contained between die 1020 and die 1030) (with other optional dies not shown between die 1020 and die 1030). Die 1010 contains high voltage supply 1011 which delivers (forces) the high voltage output to the die 1010, 1020, or 1030. TSV 1085 connects die 1010, die 1020, and die 1030. High voltage supply 1011 connects to die 1020 and die 1030 through TSV 1085. Device 1021, which optionally can comprise a switch, is used to control the provision of power from high voltage supply 1011 to die 1020 by enabling the high voltage output at the die 1020 to be fed back to the input of the high voltage supply 1011 on the die 1010 (meaning the high voltage 1011 senses the voltage on the high voltage out on the die 1020 through the switch 1021 so as to deliver the correct voltage at the die 1020).

Similarly, high voltage supply 1011 connects to die 1030 through TSV 1085. Device 1031, which optionally can comprise a switch, is used to control the provision of power from high voltage supply 1011 to die 1030 by enabling the high voltage output at the die 1030 to be fed back to the input of the high voltage supply 1011 on the die 1010 (meaning the high voltage 1011 senses the voltage on the high voltage out on the die 1030 through the switch 1031 so as to deliver the correct voltage at the die 1030).

The high voltage supply 1011 can be used, for example, as power for supply terminal SL 2 of memory cell 10 shown in FIG. 1 and used in arrays 115/120/215/220/320/415/420. Alternatively, it can supply power for all terminals WL 8, CG 7, EG 6, BL 9, SL 2, and substrate 1 of the memory cell 10 in FIG. 1 and used in memory arrays 115/120/215/220/315/320/415/420.

One embodiment containing integrated circuits 700, 800, and/or 900 is method of concurrent operation. For example, the control circuit on master die 720/810/910 can enable the concurrent operation of different flash dies, such as die 720 reading/programming/erasing while other flash die 740 is programming/reading/programming, respectively, or vice-versa.

Another embodiment containing integrated circuits 700, 800, and/or 900 is a method of IO width configuration, where the system determines how many IO bits can be supplied by a die in a read or program operation. For example, the control circuit on master die 720/810/910 can change the width of IO in a read or program operation of different flash dies, such as by expanding the IO width by combining IO widths of individual dies.

Another embodiment containing integrated circuits 700, 800, and/or 900 is method of adaptive temperature sensor configuration. For example, a temperature profile can be stored for each flash die to compensate for the temperature gradient for the die stack for specific operation since different systems result in different power consumptions, hence causing different temperature gradient.

Another embodiment containing integrated circuits 700, 800, and/or 900 is a method of TSV self test. For example, at initial configuration, a built in TSV self test connectivity engine is used to identify a defective TSV and to determine whether it needs repair by using a Redundant TSV or should be discarded. The self test can involve forcing a voltage on a TSV connection and deciding if the TSV is bad, such as by determining if the resulting current is smaller than a predetermined number. The self test also can involve forcing a current through a TSV connection and concluding that the TSV is bad if the resulting voltage is greater than a predetermined number.

A method of manufacturing a 3D flash memory device, such as one based on the embodiments described herein, will now be described. The 3D flash process formation starts with individual die process. Thereafter, dies are stacked either using die-to-wafer or wafer-to-wafer stacking schemes.

For die-to-wafer stacking, each die can be tested using KGD (Known Good Die) method to eliminate bad dies. The TSV processing can be done by VIA first (before CMOS), VIA Middle (after CMOS and before BEOL back-end-of-line), or VIA Last (after BEOL) testing. TSV formation is processed by a via etching step, which creates an (TSV) opening on the wafer. A thin liner (e.g. silicon dioxide 1000 A) is then formed on the side of the opening. Then a metallization step (e.g., Tungsten or Cu) is formed to fill the hole. A dielectric glue layer (e.g. 1 u thick) is deposited on top of the die after BEOL. TSV back end processing includes thinning, backside metal formation, micro bump, passivation, dicing.

Die-to-wafer stacking uses a temporary adhesive bonding. Each top wafer is typically thinned down to 40-75 um depending on aspect ratio and TSV diameter, for example for TSV diameter of 5um and aspect ratio of 10, a 50 um thick wafer is required. The top diced dies are stacked face up on a regular thickness bottom die through micro-bump and the whole die stack then attaches to a package substrate through flipchip bump (C4-bump).

For wafer-to-wafer bonding, the dies must have a common size, and hence, offers less flexibility in 3D die integration. The TSV process and wafer stacking process are similar as described above. The 3D stack yield in this case would be limited by the lowest yield wafer. Wafer-to-wafer stacking typically can use global wafer alignment for bonding, and hence, has higher alignment tolerance and also higher throughput (since all die stacking occurs in parallel).

References to the present invention herein are not intended to limit the scope of any claim or claim term, but instead merely make reference to one or more features that may be covered by one or more of the claims. Materials, processes and numerical examples described above are exemplary only, and should not be deemed to limit the claims. It should be noted that, as used herein, the terms "over" and "on" both inclusively include "directly on" (no intermediate materials, elements or space disposed there between) and "indirectly on" (intermediate materials, elements or space disposed there between). Likewise, the term "adjacent" includes "directly adjacent" (no intermediate materials, elements or space disposed there between) and "indirectly adjacent" (intermediate materials, elements or space disposed there between). For example, forming an element "over a substrate" can include forming the element directly on the substrate with no intermediate materials/ elements there between, as well as forming the element indirectly on the substrate with one or more intermediate materials/elements there between. The invention described herein applies to other non-volatile memory, such as stacked floating gate, ReRAM (Resistive RAM), MRAM (magnoresistive random access memory), FeRAM (Ferroelectric RAM), ROM, and other known memory devices.

What is claimed is:

1. A memory apparatus, comprising:
a first die comprising a first array of flash memory cells;
a first control circuit for generating sectors of a first size with the first array;
a second die comprising a second array of flash memory cells;
a second control circuit for generating sectors of a second size different than the first size within the second array; and
a plurality of TSV connections between the first die and second die.

2. The apparatus of claim 1, wherein the first die comprises sensing circuitry.

3. The apparatus of claim 1, wherein the first die comprises a first charge pump.

4. The apparatus of claim 3, wherein the second die is configured to use the first charge pump in reading data from the second array.

5. The apparatus of claim 1, wherein the first die comprises control logic.

6. The apparatus of claim 5, wherein the second die is configured to use the control logic.

7. The apparatus of claim 1, wherein the first size is eight bytes.

8. The apparatus of claim 1, wherein the first size is four Kbytes.

9. The apparatus of claim 1, wherein at least one of the sectors of a first size comprise multiple word lines, one erase gate, one source line, and one control gate.

10. The apparatus of claim 9, wherein at least two of the sectors of a first size share the same word line.

11. The apparatus of claim 9, wherein at least two of the sectors of a first size use different erase gates, different control gates, and different source lines.

12. The apparatus of claim 1, wherein at least one of the sectors of a first size emulates an EEPROM sector.

13. The apparatus of claim 12, wherein the at least one of the sectors of a first size that emulates an EEPROM sector comprises a plurality of word lines, one erase gate, one source line, and one control gate.

14. The apparatus of claim 12, wherein at least two of the sectors of a first size that emulate an EEPROM sector share the same word line.

15. The apparatus of claim 12, wherein at least two of the sectors of a first size that emulate an EEPROM sector use different erase gates, different control gates, and different source lines.

16. An memory apparatus, comprising:
a first die comprising a first array of flash memory cells;
a first control circuit for emulating an EEPROM with sectors of a first size using the first array;
a second die comprising a second array of flash memory cells;
a second control circuit for generating sectors of a second size different than the first size within the second array; and
a plurality of TSV connections between the first die and second die.

17. The apparatus of claim 16, wherein the first die comprises sensing circuitry.

18. The apparatus of claim 16, wherein the first die comprises a first charge pump.

19. The apparatus of claim 18, wherein the second die is configured to use the first charge pump in operating on data from the second array.

20. The apparatus of claim 16, wherein the first die comprises control logic.

21. The apparatus of claim 20, wherein the second die is configured to use the control logic.

22. The apparatus of claim 16, wherein the first die further comprises a buffer TSV circuit.

23. The apparatus of claim 16, wherein the first die further comprises a test pad.

24. The apparatus of claim 16, wherein the first die further comprises a sense circuit and a TSV is coupled to the source of a sensing cascoding device.

25. The apparatus of claim 16, wherein the plurality of TSV connections comprise a plurality of shielded TSV connections.

26. A memory apparatus, comprising:
a first die comprising a first array of flash memory cells created by a first semiconductor process;
a second die comprising a second array of flash memory cells created by a second semiconductor process different than the first semiconductor process;
a plurality of TSV connections between the first die and second die.

27. The apparatus of claim 26, wherein the first die comprises sensing circuitry.

28. The apparatus of claim 26, wherein the first die comprises a first charge pump.

29. The apparatus of claim 28, wherein the second die is configured to use the first charge pump in reading data from the second array.

30. The apparatus of claim 26, wherein the first die comprises control logic.

31. The apparatus of claim 30, wherein the second die is configured to use the control logic.

32. The apparatus of claim 26, wherein the first semiconductor process is 32 nm.

33. The apparatus of claim 26, wherein the first semiconductor process is 22 nm.

34. A memory apparatus, comprising:
a first die comprising a first array of flash memory;
a second die comprising a second array of flash memory cells;
a force-sense high voltage supply system for first and second dies; and
a plurality of TSV connections between the first die and second die.

35. The apparatus of claim 34, wherein IO widths are configurable by combining first and second dies.

36. The apparatus of claim 34, wherein the TSV connection integrity are testable by TSV self test engine on the first die.

37. The apparatus of claim 34, wherein the force-sense scheme applying to source line current bias terminal of flash memory cell.

38. A memory apparatus, comprising:
a first die comprising a first array of flash memory cells;
a second die comprising a second array of flash memory cells;
a sensing circuit shared between the first die and second die;
a plurality of TSV connections between the first die and second die.

39. The apparatus of claim 38, wherein an IO width of the memory apparatus is configurable by combining the first die and second die.

40. The apparatus of claim 39, wherein the second die is configured to use the sensing circuit.

* * * * *